(12) United States Patent
Adusumilli et al.

(10) Patent No.: US 11,410,872 B2
(45) Date of Patent: Aug. 9, 2022

(54) OXIDIZED CAVITY STRUCTURES WITHIN AND UNDER SEMICONDUCTOR DEVICES

(71) Applicant: GLOBALFOUNDRIES U.S. INC., Santa Clara, CA (US)

(72) Inventors: Siva P. Adusumilli, Burlington, VT (US); Steven M. Shank, Jericho, VT (US); John J. Ellis-Monaghan, Grand Isle, VT (US); Anthony K. Stamper, Burlington, VT (US)

(73) Assignee: GLOBALFOUNDRIES U.S. INC., Malta, NY (US)

( * ) Notice: Subject to any disclaimer, the term of this patent is extended or adjusted under 35 U.S.C. 154(b) by 0 days.

(21) Appl. No.: 16/206,375

(22) Filed: Nov. 30, 2018

(65) Prior Publication Data

US 2020/0176304 A1 Jun. 4, 2020

(51) Int. Cl.
*H01L 29/00* (2006.01)
*H01L 29/51* (2006.01)
(Continued)

(52) U.S. Cl.
CPC .... *H01L 21/76248* (2013.01); *H01L 21/3086* (2013.01); *H01L 21/30608* (2013.01); *H01L 21/76251* (2013.01); *H01L 21/76262* (2013.01); *H01L 29/0649* (2013.01); *H01L 29/1079* (2013.01)

(58) Field of Classification Search
CPC .............. H01L 29/0649; H01L 21/764; H01L 21/76283; H01L 29/78654; H01L 29/1095; H01L 21/02532; H01L 37/00; H01L 21/76264; H01L 29/0653; H01L 29/1083; H01L 29/78; G01J 5/20; G01J 2005/206;
(Continued)

(56) References Cited

U.S. PATENT DOCUMENTS 4,710,794 A * 12/1987 Koshino ............... H01L 21/187
257/501
4,888,300 A 12/1989 Burton
(Continued)

FOREIGN PATENT DOCUMENTS

| CN | 101180722 | 5/2008 |
| JP | 2009099841 | 5/2009 |
| TW | 201711190 | 3/2017 |

OTHER PUBLICATIONS

Taiwanese Office Action and Search Report in related TW Application No. 106132441 dated Dec. 7, 2018, 14 pages.
(Continued)

*Primary Examiner* — Mary A Wilczewski
*Assistant Examiner* — Tsz K Chiu
(74) *Attorney, Agent, or Firm* — Anthony Canale; Andrew M. Calderon; Roberts Calderon Safran & Cole, P.C.

(57) ABSTRACT

The present disclosure relates to semiconductor structures and, more particularly, to oxidized cavity structures within and under semiconductor devices and methods of manufacture. The structure includes: a substrate material; active devices over the substrate material; an oxidized trench structure extending into the substrate and surrounding the active devices; and one or more oxidized cavity structures extending from the oxidized trench structure and formed in the substrate material under the active devices.

17 Claims, 13 Drawing Sheets

(51) Int. Cl.
*H01L 21/762* (2006.01)
*H01L 21/308* (2006.01)
*H01L 29/10* (2006.01)
*H01L 21/306* (2006.01)
*H01L 29/06* (2006.01)

(58) Field of Classification Search
CPC .. G01J 2005/202; G01J 5/024; H01J 37/3171; H01J 2237/31701
See application file for complete search history.

(56) References Cited

U.S. PATENT DOCUMENTS

| | | | |
|---|---|---|---|
| 5,393,375 A * | 2/1995 | MacDonald | B82Y 15/00 148/DIG. 135 |
| 5,427,975 A * | 6/1995 | Sparks | B81C 1/00246 216/2 |
| 5,844,299 A | 12/1998 | Merill et al. | |
| 5,869,374 A | 2/1999 | Wu | |
| 5,943,581 A | 8/1999 | Lu et al. | |
| 5,949,144 A | 9/1999 | Delgado et al. | |
| 5,972,758 A * | 10/1999 | Liang | H01L 21/764 257/E21.549 |
| 6,093,330 A * | 7/2000 | Chong | B81C 1/00071 216/2 |
| 6,093,599 A | 7/2000 | Lee et al. | |
| 6,057,202 A | 9/2000 | Chen et al. | |
| 6,140,197 A | 10/2000 | Chu et al. | |
| 6,255,704 B1 | 7/2001 | Iwata et al. | |
| 6,258,688 B1 | 7/2001 | Tsai | |
| 6,274,920 B1 | 8/2001 | Park et al. | |
| 6,307,247 B1 * | 10/2001 | Davies | H01L 23/645 257/522 |
| 6,337,499 B1 | 1/2002 | Werner | |
| 6,376,291 B1 | 4/2002 | Barlocchi et al. | |
| 6,518,144 B2 | 2/2003 | Nitta et al. | |
| 6,518,147 B1 * | 2/2003 | Villa | H01L 21/76208 257/E21.554 |
| 6,551,944 B1 | 4/2003 | Fallica et al. | |
| 6,570,217 B1 | 5/2003 | Sato et al. | |
| 6,670,257 B1 * | 12/2003 | Barlocchi | H01L 21/2007 257/E21.573 |
| 6,720,229 B2 | 4/2004 | Norström et al. | |
| 6,833,079 B1 | 12/2004 | Giordani | |
| 6,835,631 B1 | 12/2004 | Zhen et al. | |
| 6,928,879 B2 | 8/2005 | Partridge et al. | |
| 6,992,367 B2 | 1/2006 | Erratico et al. | |
| 7,009,273 B2 | 3/2006 | Inoh et al. | |
| 7,053,747 B2 | 5/2006 | Joodaki | |
| 7,279,377 B2 | 10/2007 | Rueger et al. | |
| 7,294,536 B2 * | 11/2007 | Villa | H01L 29/0649 438/149 |
| 7,326,625 B2 | 2/2008 | Jeong et al. | |
| 7,354,786 B2 | 4/2008 | Benzel et al. | |
| 7,427,803 B2 | 9/2008 | Chao et al. | |
| 7,662,722 B2 | 2/2010 | Stamper et al. | |
| 7,678,600 B2 | 3/2010 | Villa et al. | |
| 7,906,388 B2 | 3/2011 | Sonsky | |
| 8,203,137 B2 | 6/2012 | Cho et al. | |
| 8,319,278 B1 | 11/2012 | Zeng et al. | |
| 8,575,690 B1 | 11/2013 | Hsieh | |
| 8,652,951 B2 | 2/2014 | Huang et al. | |
| 8,674,472 B2 | 3/2014 | Botula et al. | |
| 8,907,408 B2 | 12/2014 | Sedlmaier et al. | |
| 8,927,386 B2 | 1/2015 | Wu et al. | |
| 9,029,229 B2 | 5/2015 | Adkisson et al. | |
| 9,048,284 B2 | 6/2015 | McPartlin et al. | |
| 9,059,252 B1 * | 6/2015 | Liu | G02B 6/12004 |
| 9,159,817 B2 | 10/2015 | Camillo-Castillo et al. | |
| 9,177,866 B2 | 11/2015 | Davies | |
| 9,224,858 B1 | 12/2015 | Camillo-Castillo et al. | |
| 9,324,846 B1 | 4/2016 | Camillo-Castillo et al. | |
| 9,349,793 B2 | 5/2016 | Jaffe et al. | |
| 9,355,972 B2 | 5/2016 | Dunn et al. | |
| 9,570,564 B2 | 2/2017 | Alperstein et al. | |
| 9,640,538 B2 | 5/2017 | Liu et al. | |
| 9,711,392 B2 * | 7/2017 | Dehe | H01L 21/31058 |
| 9,722,057 B2 | 8/2017 | Camillo-Castillo et al. | |
| 9,726,547 B2 | 8/2017 | Liu et al. | |
| 9,917,186 B2 | 3/2018 | Laven et al. | |
| 9,922,973 B1 | 3/2018 | Shank et al. | |
| 10,062,757 B2 | 8/2018 | Toia et al. | |
| 10,109,490 B1 | 10/2018 | Lin et al. | |
| 10,446,643 B2 * | 10/2019 | Adusumilli | H01L 29/78606 |
| 10,461,152 B2 * | 10/2019 | Stamper | H01L 29/1083 |
| 10,553,675 B2 * | 2/2020 | Schmidt | H01L 21/02532 |
| 10,833,153 B2 * | 11/2020 | Liu | H01L 21/764 |
| 10,903,316 B2 * | 1/2021 | Stamper | H01L 23/66 |
| 10,923,577 B2 * | 2/2021 | Kantarovsky | H01L 21/02532 |
| 2002/0043686 A1 | 4/2002 | Bolam et al. | |
| 2002/0195681 A1 | 12/2002 | Melendez et al. | |
| 2003/0067014 A1 | 4/2003 | Tsuruta et al. | |
| 2004/0180510 A1 | 9/2004 | Ranade et al. | |
| 2004/0217434 A1 | 11/2004 | Lee et al. | |
| 2004/0217443 A1 * | 11/2004 | Davies | H01L 27/08 257/E21.022 |
| 2005/0176222 A1 | 8/2005 | Ogura | |
| 2006/0091453 A1 | 5/2006 | Matsuda et al. | |
| 2006/0138541 A1 | 6/2006 | Nakamura et al. | |
| 2006/0214258 A1 | 9/2006 | Kiyotoshi | |
| 2006/0228864 A1 | 10/2006 | Chen et al. | |
| 2007/0181920 A1 | 8/2007 | Renna et al. | |
| 2007/0238250 A1 | 10/2007 | Zhang et al. | |
| 2008/0044979 A1 | 2/2008 | Wells et al. | |
| 2008/0073747 A1 | 3/2008 | Chao et al. | |
| 2009/0072351 A1 * | 3/2009 | Meunier-Beillard | H01L 21/76264 257/E29.089 |
| 2009/0101997 A1 | 4/2009 | Lammel et al. | |
| 2009/0127648 A1 | 5/2009 | Chen et al. | |
| 2009/0191687 A1 | 7/2009 | Hong et al. | |
| 2010/0035403 A1 | 2/2010 | Brown et al. | |
| 2010/0059854 A1 | 3/2010 | Lin et al. | |
| 2010/0109120 A1 | 5/2010 | Fucsko et al. | |
| 2010/0117136 A1 | 5/2010 | Yasuda | |
| 2012/0028401 A1 | 2/2012 | De Munck et al. | |
| 2012/0038024 A1 | 2/2012 | Botula et al. | |
| 2012/0211805 A1 | 8/2012 | Winkler et al. | |
| 2012/0292700 A1 | 11/2012 | Khakifirooz et al. | |
| 2013/0043490 A1 | 2/2013 | Sorada | |
| 2013/0087889 A1 | 4/2013 | Tan et al. | |
| 2013/0320459 A1 | 12/2013 | Shue et al. | |
| 2014/0042595 A1 | 2/2014 | Schulze et al. | |
| 2014/0097402 A1 | 4/2014 | Wang et al. | |
| 2014/0151852 A1 | 6/2014 | Adkisson et al. | |
| 2014/0252481 A1 * | 9/2014 | Flachowsky | H01L 29/66545 257/349 |
| 2014/0353725 A1 * | 12/2014 | Adkisson | H01L 29/66242 257/197 |
| 2015/0179755 A1 | 6/2015 | Rooyackers et al. | |
| 2015/0179791 A1 | 6/2015 | Kudou | |
| 2015/0194416 A1 * | 7/2015 | Cheng | H01L 21/3081 257/368 |
| 2015/0318665 A1 | 11/2015 | Liang | |
| 2015/0348825 A1 | 12/2015 | Hebert | |
| 2016/0372592 A1 | 12/2016 | Cho | |
| 2017/0110574 A1 * | 4/2017 | Laven | H01L 21/02664 |
| 2017/0117224 A1 | 4/2017 | Adusumilli et al. | |
| 2017/0170056 A1 | 6/2017 | Jaffe et al. | |
| 2018/0083098 A1 | 3/2018 | Goktepeli | |
| 2019/0013382 A1 | 1/2019 | Stamper et al. | |

OTHER PUBLICATIONS

Office Action in related U.S. Appl. No. 15/703,220 dated Sep. 5, 2018, 27 pages.

Response to Office Action in related U.S. Appl. No. 15/703,220, filed Dec. 5, 2018, 12 pages.

Taiwanese Office Action in related U.S. Appl. No. 10/711,2403 dated Oct. 18, 2018, 9 pages.

(56) References Cited

OTHER PUBLICATIONS

Hashimoto et al., "A Study on Suppressing Crosstalk Through a Thick SOI Substrate and Deep Trench Isolation", IEEE, Jul. 2013, vol. 1, No. 7, 7 pages.
Ohguro et al., "High performance digital-analog mixed device on a Si substrate with resistivity beyond 1 kΩ cm", IEEE, 2000, 4 pages.
Response to Office Action in related U.S. Appl. No. 15/645,655, filed Oct. 18, 2018, 12 pages.
Office Action in related U.S. Appl. No. 15/645,655 dated Jul. 19, 2018, 17 pages.
Taiwanese Office Action in related U.S. Appl. No. 10/613,2441 dated Jul. 16, 2018, 10 pages.
Final Office Action in related U.S. Appl. No. 15/645,655 dated Jan. 31, 2019, 16 pages.
Office Action in U.S. Appl. No. 16/241,441 dated May 12, 2020, 8 pages.
Office Action in U.S. Appl. No. 16/575,675 dated Jun. 30, 2020, 11 pages.
Notice of Allowance in U.S. Appl. No. 15/703,220 dated Jun. 15, 2020, 8 pages.
DE Office Action in DE Application No. 102018222690.3 dated May 28, 2020, 9 pages.
Office Action in related U.S. Appl. No. 15/876,727 dated Jan. 11, 2019, 10 pages.
Office Action in U.S. Appl. No. 15/703,220 dated Oct. 18, 2019, 18 pages.
Response to Office Action in U.S. Appl. No. 15/703,220 dated Jan. 17, 2020, 12 pages.
Final Office Action in U.S. Appl. No. 15/703,220 dated Mar. 16, 2020, 21 pages.
Response to Final Office Action in U.S. Appl. No. 15/703,220 dated Apr. 20, 2020, 16 pages.
Taiwanese Office Action and Search Report in related TW Application No. 106132441 dated Mar. 3, 2020, 10 pages.
Taiwanese Office Action in TW Application No. 106132441 dated Jun. 4, 2019, 10 pages.
Response to Final Office Action in U.S. Appl. No. 15/703,220, filed Apr. 25, 2019, 13 pages.
Second Response to Final Office Action in U.S. Appl. No. 15/703,220, filed Jun. 5, 2019, 13 pages.
Notice of Allowance in U.S. Appl. No. 15/876,727 dated Jun. 12, 2019, 9 pages.
Notice of Allowance in U.S. Appl. No. 15/645,655 dated Jul. 19, 2019, 9 pages.
Notice of Allowance in related TW Application No. 107112403 dated Mar. 27, 2019, 4 pages.
Response to Office Action in related U.S. Appl. No. 15/876,727 dated Apr. 11, 2019, 7 pages.
Final Office Action in related U.S. Appl. No. 15/703,220 dated Mar. 19, 2019, 17 pages.
Response to Final Office Action in related U.S. Appl. No. 15/645,655 dated Mar. 20, 2019, 11 pages.
Taiwanese Notice of Allowance in TW Application No. 108139071 dated Feb. 8, 2021, 4 pages.
Final Office Action in U.S. Appl. No. 16/538,062 dated Mar. 2, 2021, 6 pages.
Office Action in U.S. Appl. No. 16/791,214 dated Mar. 18, 2021, 10 pages.
Notice of Allowance in U.S. Appl. No. 16/575,675 dated Oct. 15, 2020, 8 pages.
Response to Office Action in U.S. Appl. No. 16/575,675, filed Sep. 14, 2020, 8 pages.
Taiwanese Office Action in TW Application No. 108139071 dated Aug. 21, 2020, 9 pages.
Taiwanese Notice of Allowance in TW Application No. 106132441 dated Sep. 8, 2020, 4 pages.
Response to Office Action in U.S. Appl. No. 16/241,441, filed Aug. 12, 2020, 11 pages.
Office Action in U.S. Appl. No. 16/538,062 dated Oct. 6, 2020, 7 pages.
Notice of Allowance in U.S. Appl. No. 16/241,441 dated Nov. 9, 2020, 8 pages.
Response to Office Action in U.S. Appl. No. 16/538,062, filed Jan. 4, 2021, 9 pages.
Notice of Allowance in U.S. Appl. No. 16/791,214 dated Jun. 24, 2021, 11 pages.
Response to Office Action in U.S. Appl. No. 16/791,214 dated Jun. 11, 2021, 8 pages.
Notice of Allowance in U.S. Appl. No. 16/538,062 dated May 5, 2021, 4 pages.
Response to Final Office Action in U.S. Appl. No. 16/538,062, filed Apr. 12, 2021, 7 pages.
Chinese Office Action in CN Application No. 201810535518.3 dated Oct. 9, 2021, 10 pages.
Chinese Office Action in CN Application No. 201810535518.3 dated Apr. 6, 2022, 9 pages.

* cited by examiner

OXIDIZED CAVITY STRUCTURES WITHIN AND UNDER SEMICONDUCTOR DEVICES

FIELD OF THE INVENTION

The present disclosure relates to semiconductor structures and, more particularly, to oxidized cavity structures within and under semiconductor devices and methods of manufacture.

BACKGROUND

Radio frequency (RF) devices are used in many different types of communication applications. For example, RF devices can be used in cellular telephones with wireless communication components such as switches, MOSFETs, transistors and diodes.

As cellular telephones become more complex and commoditized, there is an increasing need to provide higher performance and lower price points for the wireless communication components. A significant fraction of the cost of manufacturing an RF switch, for example, is the cost to engineer very high linearity such that harmonic distortion is extremely low and meets product specifications.

RF devices are typically manufactured on high resistivity silicon wafers or substrates to achieve the needed RF linearity. State-of-the-art trap rich silicon on insulator (SOI) high resistivity substrates offer excellent vertical isolation and linearity, but the SOI wafer can be up to 50% of the total manufacturing cost because they can be 5 to 10 times the cost of high resistivity non-SOI substrates, i.e., a RF device formed on a SOI wafer could have a total normalized manufacturing cost of 1.0 while a similar device formed on a high resistivity non-SOI bulk wafer could have a total normalized manufacturing cost of 0.6. Devices built on bulk Si substrates have been known to suffer from degraded linearity, harmonics, noise, and leakage currents, any of which will degrade device performance thus necessitating the higher cost of SOI wafers.

SUMMARY

In an aspect of the disclosure, a structure comprises: a substrate material; an oxidized trench structure extending into the substrate material; and one or more oxidized cavity structures extending from the oxidized trench structure and formed in the substrate material under active devices.

In an aspect of the disclosure, a structure comprises: a crystalline substrate material with an active region; at least one oxidized cavity structure formed in the crystalline substrate material under the active region; and an oxidized trench extending into the crystalline substrate material and connecting to the at least one oxidized cavity structure formed in the crystalline substrate, the oxidized trench also surrounding the active region.

In an aspect of the disclosure, a method comprises: forming a trench structure into a substrate material and which surrounds an active area; forming cavity structures in the substrate material under the active are and which is open to the trench structure; and oxidizing at least sidewalls of the cavity structures through the opening extending from the trench structure.

BRIEF DESCRIPTION OF THE DRAWINGS

The present disclosure is described in the detailed description which follows, in reference to the noted plurality of drawings by way of non-limiting examples of exemplary embodiments of the present disclosure.

FIG. 2A shows a top view of the cavity structures with a trench region, and respective fabrication processes in accordance with aspects of the present disclosure; whereas.

FIG. 3A shows a top view of the cavity structures with a partially oxidized trench region, and respective fabrication processes in accordance with another aspects of the present disclosure; whereas.

FIG. 4A shows a top view of the cavity structures with an oxide filled trench region, and respective fabrication processes in accordance with yet another aspect of the present disclosure; whereas.

FIG. 5A shows a top view of the oxidized cavity structures with a partially filled trench region, and respective fabrication processes in accordance with further aspects of the present disclosure; whereas.

DETAILED DESCRIPTION

Figure 1A:
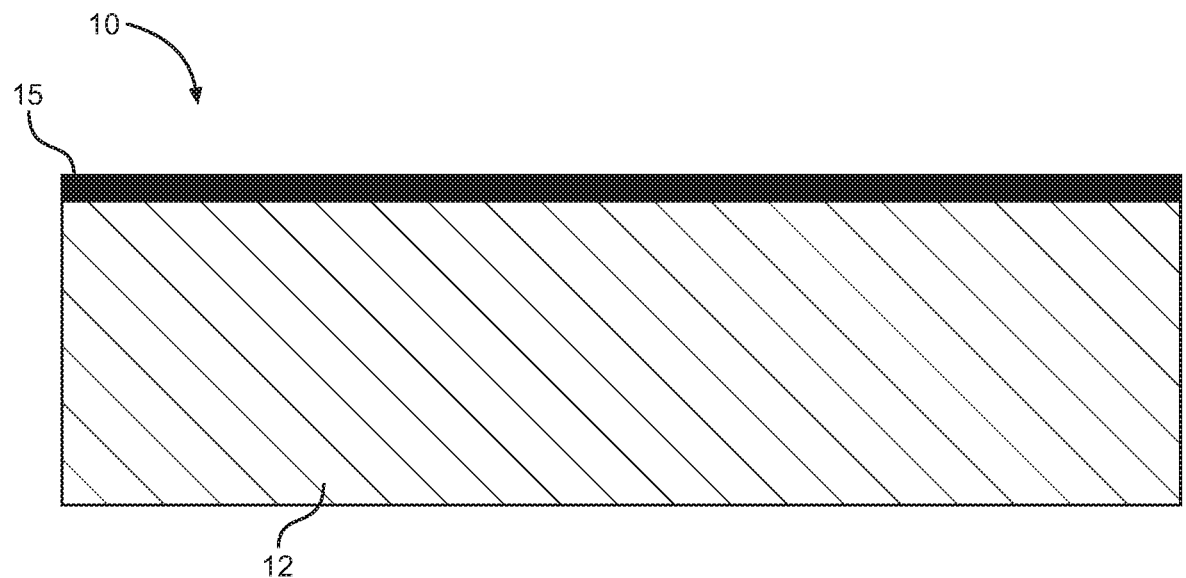
FIGS. 1A-1H show structures and respective fabrication processes in accordance with aspects of the present disclosure.

The present disclosure relates to semiconductor structures and, more particularly, to oxidized cavity structures within and under semiconductor devices and methods of manufacture. More specifically, the present disclosure includes cavity structures which have oxidized sidewalls. In embodiments, the localized oxidized cavity structures can also be completely filled with oxide. Advantageously, the cavity structures disclosed herein improve performance of bulk devices by reducing harmonics generated from the substrate, as an example. In addition, advantageously, the localized oxidized cavity structures will reduce junction capacitance and substrate losses.

In embodiments, the cavity structures are provided under or within devices, e.g., FET body or channel and the FET source/drain. The cavity structures can be oxidized and also sealed with semiconductor material, i.e. Si or SiGe, embedded under the FET. By oxidizing the sidewalls underneath the devices through trench structures it is possible to provide a two (2)-way oxidation or multi-way oxidation. In embodiments, the cavity structures can be completely filled or partially filled and surrounded by oxide filled trench structures, where the oxide used to fill the trenches, e.g., deep trenches, shallow trench isolation structures, etc., is also used to line or fill the cavity structures. The use of the oxidized cavity structures will reduce junction capacitance and substrate losses. In addition, the oxidized cavities could provide full isolation of devices, while avoiding the need for expensive SOI wafers.

In embodiments, the cavity structures can be formed in bulk silicon wafers with either standard resistivity of about 0.01 to 100 ohm-cm or high resistivity silicon wafers, e.g., a resistivity of about >1 Kohm-cm to about 10 Kohm-cm or higher. In embodiments, the cavity structures are formed under source/drain regions extending below a PN junction, under gate structures or below the source/drain PN junction, above and not touching the cavity. In further embodiments, the cavity structures can be formed with a dual well stack with deep trench isolation structures to avoid depletion region punch through, or in a triple well structure without deep trench isolation structures, amongst other implementations described herein.

In any of the disclosed implementations, the cavity structures can be used with radio frequency (RF) FETs or NPNs, such as FET switches, with the cavity structures under such devices or under source/drain regions or combinations thereof on a single wafer. Alternatively, the cavity structures may be used under any active device, such as a NPN or SiGe NPN, or passive devices to reduce substrate parasitics. In any of the disclosed implementations, trenches (bars) or holes leading to the cavity structures are subjected to an optional annealing process prior to being sealed with an epitaxial material (or oxide), which will soften the edges. For example, the annealing process will form a curvature at the entrance of the trench or hole, which enables subsequent deposition processes to seal the cavity through an epi and/or reflow process. The sealing material can be a combination of epitaxial SiGe and Si, for example, which under certain temperature or deposition conditions will result in a non-planar surface topography (e.g., concave surface or convex surface).

The structures of the present disclosure can be manufactured in a number of ways using a number of different tools. In general, though, the methodologies and tools are used to form structures with dimensions in the micrometer and nanometer scale. The methodologies, i.e., technologies, employed to manufacture the structures of the present disclosure have been adopted from integrated circuit (IC) technology. For example, the structures are built on wafers and are realized in films of material patterned by photolithographic processes on the top of a wafer. In particular, the fabrication of the structures uses three basic building blocks: (i) deposition of thin films of material on a substrate, (ii) applying a patterned mask on top of the films by photolithographic imaging, and (iii) etching the films selectively to the mask.

FIG. 1A shows an incoming structure in accordance with aspects of the present disclosure. In particular, the structure 10 includes a substrate 12. The substrate 12 can comprise any semiconductor, such as Si, GaAs, etc. of any resistivity known in the art, e.g., either solid, attached to an insulating wafer such as glass, formed into a SOI wafer, etc. In embodiments, the substrate 12 is composed of crystalline silicon. In another embodiment, the substrate 12 can be composed of any suitable semiconductor materials such as, e.g., Si, SiGe, SiGeC, SiC, GaAs, InAs, InP, and other III/V or II/VI compound semiconductors. For example, the substrate 12 is composed of high resistivity silicon with resistivity in the range of about between 1 Kohm-cm to 10 Kohm-cm, as an illustrative example. It should be recognized that resistivities of 1K ohm-cm and greater are sufficient to significantly reduce substrate induced harmonic distortion and losses. Higher resistivities, though, are also contemplated to 20 Kohm-cm or greater.

Still referring to FIG. 1A, one or more pad films 15, such as but not limited to, silicon dioxide (oxide) and silicon nitride (nitride) are deposited on the substrate 12. Alternatively, any combination of conductors, semiconductors, or insulators can be used to form the pad films 15. In embodiments, the nitride can be deposited by a conventional deposition process, e.g., chemical vapor deposition (CVD), to a thickness of about 100 nm to 200 nm; whereas, the oxide can be deposited to a thickness of about to 5-30 nm. It should be understood, though, that other dimensions are also contemplated herein. The oxide can be grown using a thermal oxidation or other methods known in the art such as CVD (chemical vapor deposition), PVD (plasma vapor deposition), or ALD (atomic layer deposition). If the substrate 12 is formed from silicon then the oxide can be formed in furnace oxidizations of the silicon.

Figure 1B:
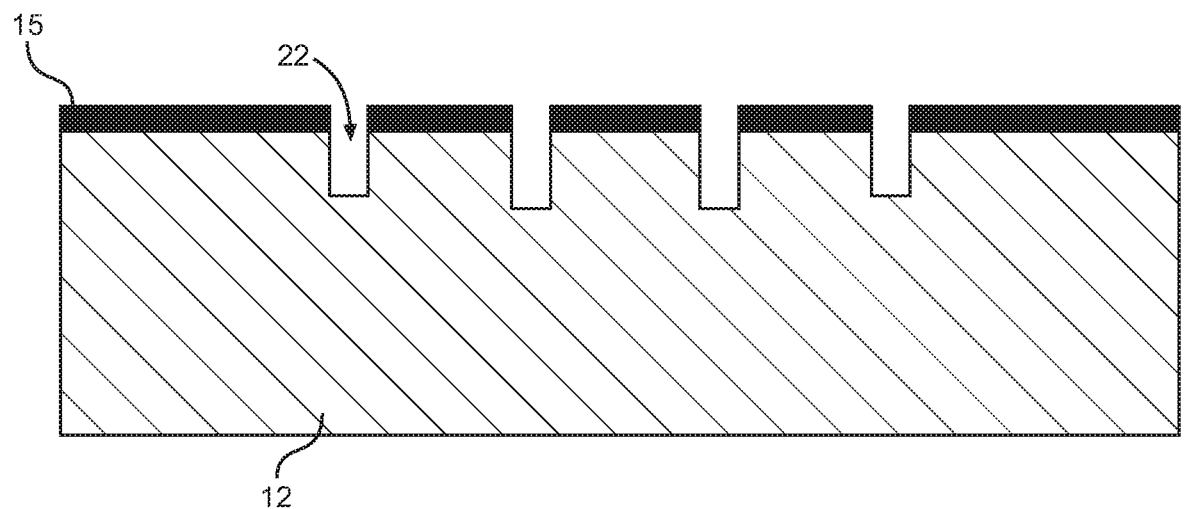

Referring to FIG. 1B, openings or trenches 22 are patterned on the pad dielectric films 15, followed by an etching and trench formation into the substrate 12. The trenches 22 can include, as viewed from above or below, "holes" and/or "bars". In embodiments, the holes would have 1:1 aspect ratio as seen from above, while the bars would have aspect ratios >1:1, such as 10:1 or 100:1, as seen from above.

In more specific embodiments, the trenches 22 can be formed by conventional lithography and etching processes. For example, a resist (not shown) formed over the pad dielectric films 15 is exposed to energy (light) to form a pattern (opening). An etching process with a selective chemistry, e.g., reactive ion etching (RIE), will be used to form one or more trenches 22 through the openings of the resist, through the pad films 15 and into the substrate 12. The resist can then be removed by a conventional oxygen ashing process or other known stripants. The width of the trenches 22 is determined by the lithography resolution. In one illustrative example, the pad films are 100 nm thick, the trenches are 120 nm wide, holes and the trenches are 0.7 micron deep into the substrate 12.

Figure 1C:
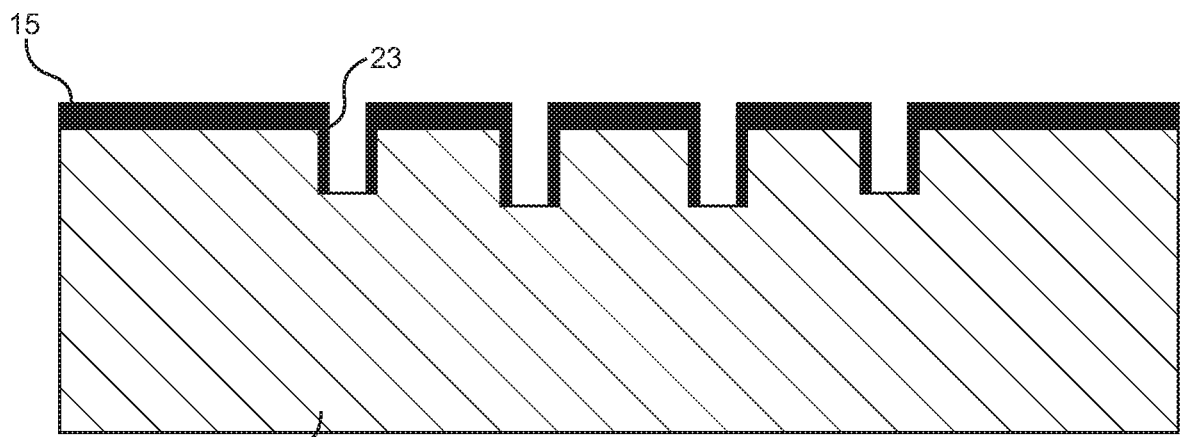

Referring to FIG. 1C, a sidewall liner 23 (also referred to as a spacer) is formed on the sidewalls of the trenches 22 by depositing a dielectric material and anisotropic etching the dielectric material from the bottom and top planar features of the structure. In embodiments, the sidewall liner 23 can be an oxide material, as an example. In embodiments, the oxide could be composed of a combination of a thermal oxidization of oxidization of the silicon substrate 12 in a furnace followed by a CVD, ALD or any other known oxide or nitride deposition methods. In embodiments, the anisotropic etch could consist of a RIE using a perfluorocarbon-based chemistry as is known in the art, which etches material from planar surfaces but leaves the dielectric material on the sidewall of the trenches 22. The pad films 15 are not fully removed during the sidewall liner etch.

In embodiments, the sidewall liner 23 is one or more of any suitable dielectric materials such as one or more oxide or nitride layers or combination of dielectric layers deposited using any known deposition method, e.g., CVD, thermal oxidization of the silicon substrate, or ALD or any of these combinations. The sidewall liner 23 should robustly coat the sidewalls of the trenches 22 in order to protect the underlying substrate material from subsequent etching processes (for cavity formation).

To achieve this robust sidewall coverage, the dielectric material or materials needs to be thick enough to leave a thick film on the sidewalls of the trenches 22 but not too thick that it pinches off the top opening of the trenches 22, which would prevent cavity formation during the successive cavity etch. For example, 40 nm of nitride can be deposited on a 100 nm wide trench. In another embodiment, for example, the sidewall of trenches 22 are thermally oxidized to form a $SiO_2$ layer which extends under the dielectric films 15. Following this thermal oxidization, the sidewall liner 23 can undergo an anisotropic etch. In embodiments, the top surface of pad film 15 is exposed to the spacer etch and is thinned but not fully removed.

Figure 1D:
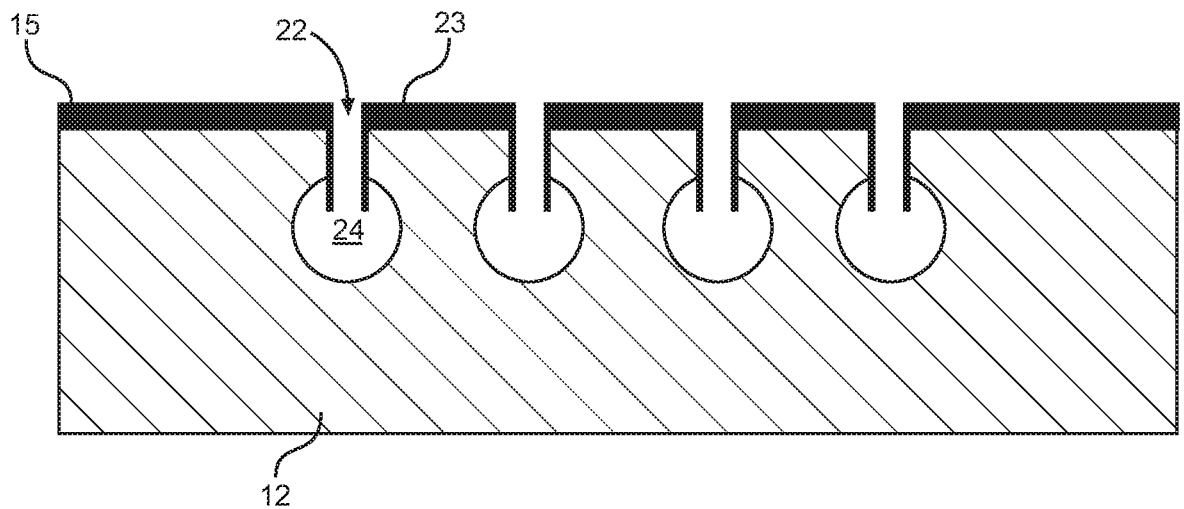

As shown in FIG. 1D, cavity structures 24 are selectively formed in the substrate 12 by a substrate etching process through the bottom of the trenches 22. The pad films 15 on the substrate surface and the spacer 23 (e.g., sidewall liner) on the side of the trenches 22 protect the substrate 12 from being unintentionally etched. In embodiments, an optional vapor or liquid HF treatment, hydrogen plasma, anneal, basic or acidic chemical clean, or any process known to remove thin or native dielectrics or residual spacer etch polymer from the substrate 12 (e.g., silicon) can be used to remove any excessive dielectric at a bottom of the trenches 22 prior to etching the cavity structures 24. The post sidewall liner etch cleans (e.g., anisotropic etch) should leave a robust dielectric liner 23 on the top corner and sidewall of the trenches 22 to prevent etching of the substrate 12 through the sidewall of the trenches 22 during the cavity formation. If a thermal oxide formed in a furnace for spacer 23 is used, then silicon under the pad films 15 are oxidized, which may provide a better protective barrier to prevent unintentional substrate 12 etching during the cavity 24 formation.

Following the formation of the sidewall liner or spacer 23 and optional clean(s), exposed substrate material at the bottom of the trench 22 can be removed to form the cavity structures 24. To avoid unintentional etching of the substrate 12 on the sidewall of the trenches and top surface of the structure, the pad dielectric material 15 and sidewall liner 23 should completely cover the substrate 12. In embodiments, the exposed substrate material 12 can be removed by a wet etching process or dry etching process. For example, dry etchants can include plasma-based $CF_4$, plasma-based $SF_6$, or gas $XeF_4$ silicon etch, etc., and wet etching processes can include KOH and $NH_4OH$. In embodiments, the cavity structures 24 can be formed under what will be the FET source/drain regions extending to a bottom of a PN junction under and between gate structures; under the FET gate; or both. Alternatively, the cavity structures 24 can be formed under any passive device, such as a silicon diffusion or polysilicon resistor, or active device, such as a FET, SiGe HBT, bipolar junction transistor, MESFET, etc.

In embodiments, the upper surface of the cavity structures 24 can be about 300 nm in depth below the top surface of the substrate 12; although other dimensions are also contemplated herein. In addition, the cavity structures 24 can have a diameter of about 200 nm to about 800 nm as an example; although other dimensions are contemplated herein. If the cavity structures 24 are under the source/drain regions of a FET, the cavity structures 24 may extend to under the gate FET; if the cavity structures are under the FET gate, then it may extend to under the FET source/drain (e.g., extending partially but not completely under the gate).

Figure 1E:
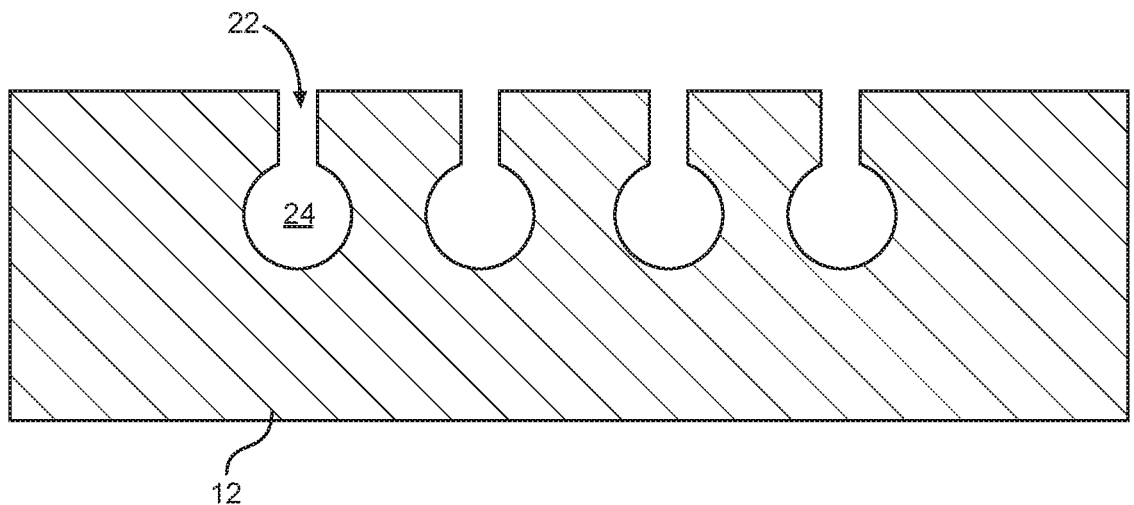

In FIG. 1E, the sidewall liner 23 and pad dielectrics 15 are removed from the structure, exposing the upper surface of the substrate 12 and the sidewalls of the trenches 22. In embodiments, the sidewall liner 23 and pad dielectrics 15 can be removed by a conventional etching process selective to such materials. For example, the sidewall liner 23 and pad dielectrics 15 can be removed by using only or a combination of hot phosphorous followed by an HF chemistry or vice-versa depending on the single dielectric layer or stack of different dielectric layers used for sidewall liner.

Figure 1F:
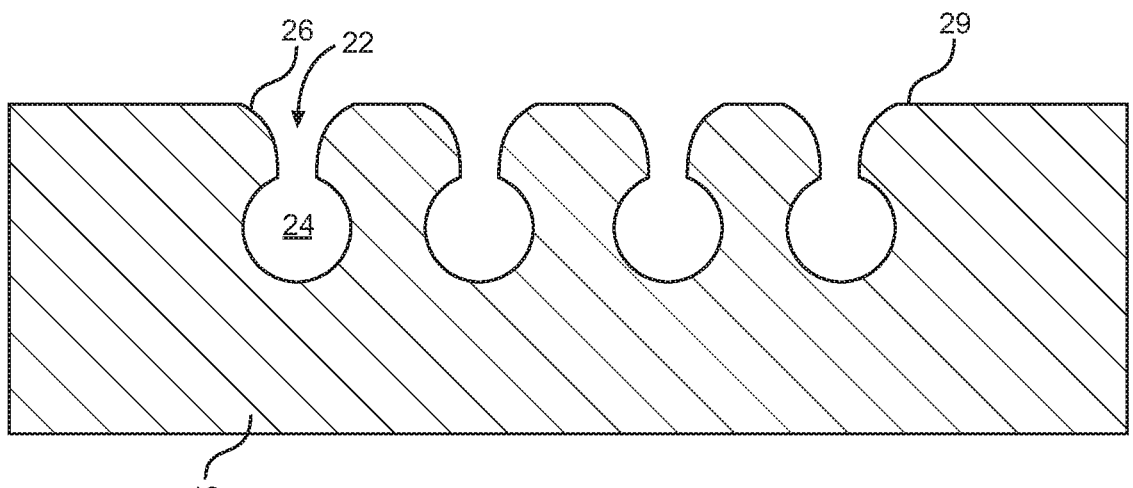

Following the removal of the sidewall liner 23 and pad dielectrics 15, the trenches 22 are subjected to an optional annealing process to soften or round (curve) the edges of the trenches, as shown representatively at reference numeral 26 in FIG. 1F. By way of one example, following a HF preclean process, the structure can undergo an annealing process at a temperature range of about 800° C. to about 1100° C., for up to about 60 seconds. In more specific embodiments, the annealing process can be at a temperature of about 650° C. for 60 seconds. In embodiments, the annealing process can be performed in an $H_2$ atmosphere; although other hydrogen atmospheres are also contemplated herein, e.g., $NH_3$, $B_2H_6$, $PH_3$, $AsH_2$ or other gases bonded to hydrogen. In embodiments, the annealing in an $H_2$ or other hydrogen atmosphere may remove any native or other oxide from the silicon substrate surface. This annealing process may smooth or reflow the walls of the cavity structures 24. If little or no curvature 26 is used, then the annealing temperature, time, or hydrogen-based gas flow is reduced to eliminate or minimize the silicon substrate reflow.

In embodiments, the critical dimension between the optionally curved silicon 26 at the top of the trenches 22 can be increased by approximately 30% or more during the anneal. In preferred embodiments, though, the annealing process should increase the critical dimension of the curved silicon 26 at the top of the trenches 22 by about 20%. For example, with a trench opening of 120 nm, the critical dimension of the silicon curvature post annealing can increase to about 156 nm, as one non-limiting illustrative example. In this way, the volume at the opening at the top of the trench will be increased, which will effectively allow for more material to be deposited and reflowed therein to completely seal the trench. It should be understood by those of skill in the art that the curvature 26 can be adjusted by temperature and gas flow. For example, the radius of curvature and the critical dimension between the curved silicon at the top of trenches 22 can be increased by increasing the temperature and with adding $H_2$ the required temperature for certain curvatures is reduced.

Figure 1G:
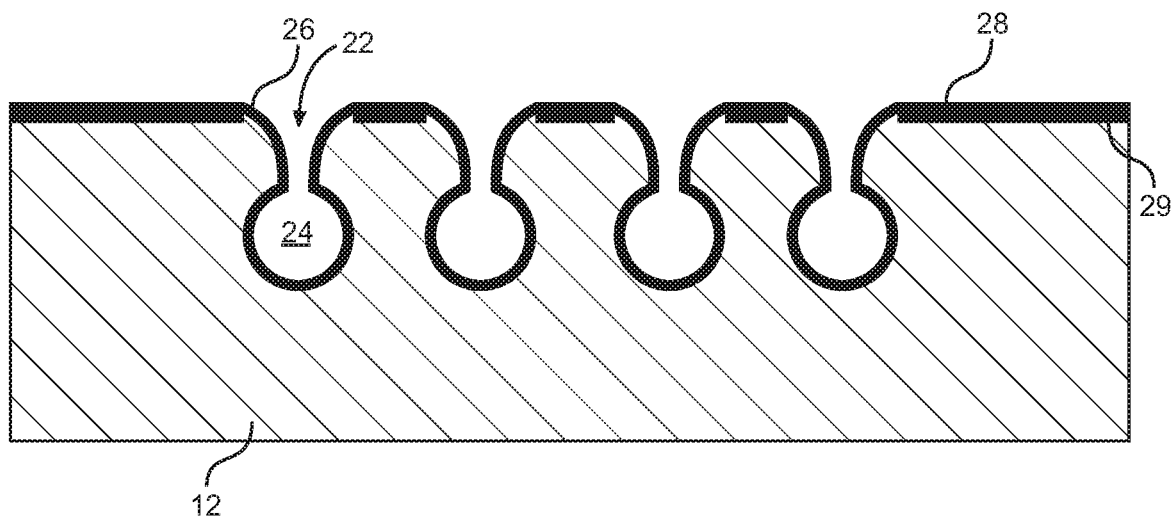

In FIG. 1G, a material 28 is deposited or epitaxially grown on the surface 29 of the substrate 12 including, e.g., the optional surface of the curvature 26, sidewalls of the trenches 22 and sidewalls of the cavity structures 24. In embodiments, the material 28 can be epitaxial SiGe deposited or grown using ultra high vacuum CVD (UHVCVD); although other semiconductor materials, poly or epi films, and deposition processes are also contemplated herein. By way of example, SiGe material can be deposited or grown at a temperature of about 600° C. to 750° C., resulting in a thickness of about 5 nm to about 50 nm. In embodiments, 15 nm of SiGe is deposited or grown at 650° C. and the trench width 22 is 120 nm. It should be understood that other thicknesses of the material 28 can be applied, depending on the critical dimension of the trenches 22. In general, as the width of the trench 22 increases, the thickness of material 28 to fill in the top of the trench 22 during the subsequent reflow anneal increases.

In embodiments, the Ge concentration of the SiGe can be about 5% to about 30%, as an example. In further embodiments, the Ge concentration of the SiGe is graded from 0% to the maximum percent and then graded back to 0%. In embodiments, the maximum percent of Ge can be about 20%. The SiGe will deposit on the exposed surfaces although the SiGe thickness in the sidewalls of the trench 22 could be thinner on planar surfaces 29 of the substrate 12 as compared to sidewalls 26 and cavity structures 24, as shown in FIG. 1G.

Figure 1H:
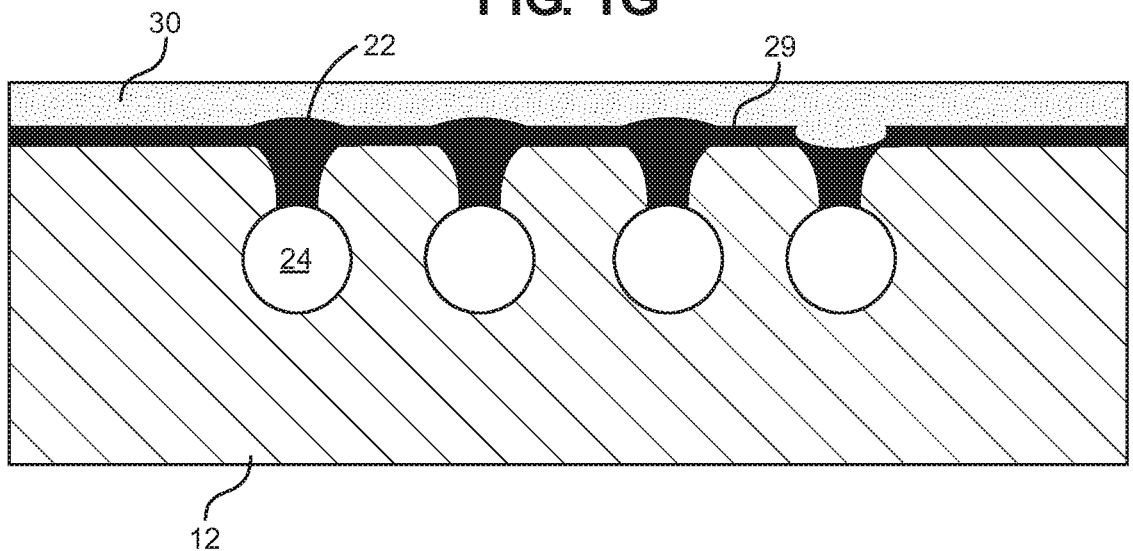

As shown in FIG. 1H, following the deposition or growth of the material 28, the wafer is heated to equal to or greater than the reflow temperature of material 28 so that material 28 fills in the top of trench 22. This can result in a non-planar surface topography (e.g., concave surface or convex surface). For the case where the substrate 12 is silicon, since SiGe has a lower reflow temperature than silicon, SiGe material 28 can be reflowed into the opening of the trench 22 to plug or fill the top of the trench 22 without filling in the cavity structures 24. In embodiments, the reflow temperature is 800-1050° C. and the reflow time is anywhere up to about 600 seconds. In embodiments, the reflow temperature is 850° C. and the reflow time is 60 seconds. In embodiments, some of SiGe or Si—SiGe—Si layer 26 is left coating the walls of the cavity structures 24.

After material 28 is optionally reflowed, a semiconductor material 30 is deposited or grown over the trenches 22 (and the remaining surface of the structure), including over the increased opening of the trenches 22, as shown in FIG. 1H. In embodiments, the semiconductor material 30 can be a second trench sealing layer, e.g., Si material, deposited or grown using an epi process to either finishing sealing the trenches 22 or depositing or growing additional material over the wafer surface 29 and trench top surface 22, thereby forming cavity structures 24 (comprising the sealed trench and cavity).

In embodiments, the top of the trench 22 is fully sealed with SiGe material 28 prior to silicon layer 30 deposition or growth. In embodiments, the semiconductor material 30 can be deposited or grown to a thickness of about 150 nm in a deposition chamber having a temperature of about 850° C. to about 1050° C. for about 60 seconds. At this temperature, the material 28 will continue to reflow (although other temperatures and time are contemplated herein depending on the desired surface topography of the reflowed material 28), continuing to gravitate or migrate into the upper portion of the trenches 22 (e.g., typically at the smallest critical dimension).

It should also be noted that application of temperature during the reflow process will affect the size and shape of the cavity structure 24. In particular, the cavity structure 24 becomes a different shape, e.g., oval shape, slightly shrinking its volume compared to its original shape (see, e.g., FIG. 2D). If the cavity structure 24 is not sealed prior to silicon material 28 deposition, then some of semiconductor layer 30 may deposit inside the cavity.

Figure 2A:
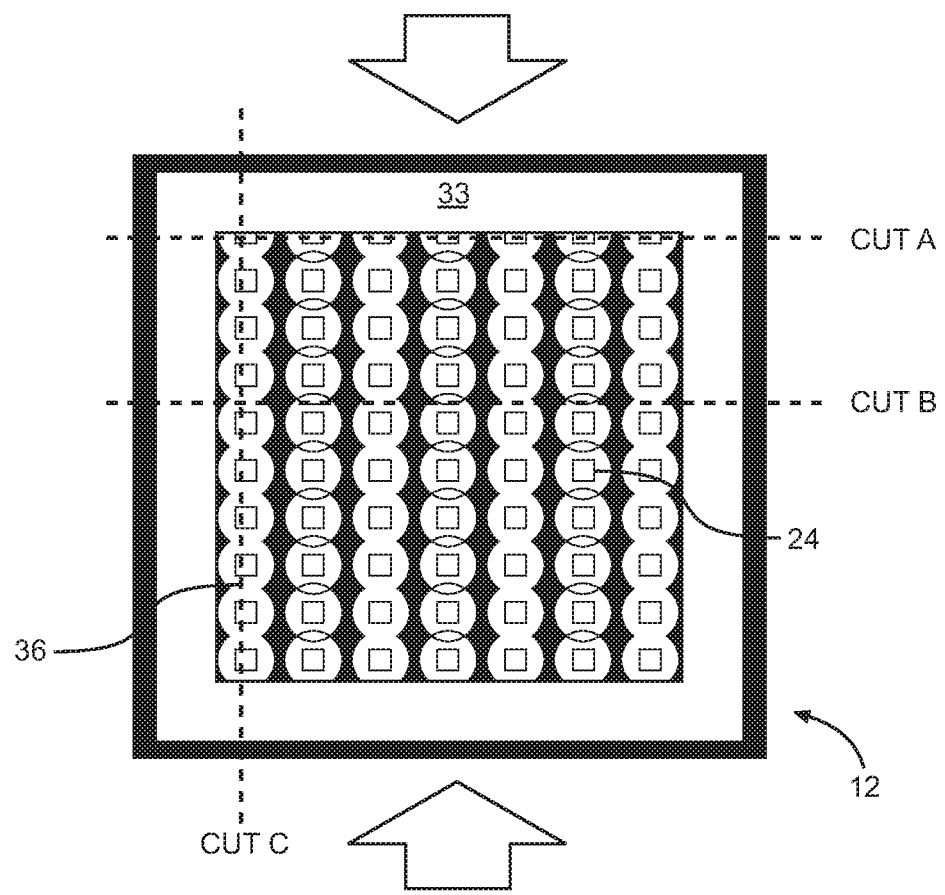
Figure 2B:
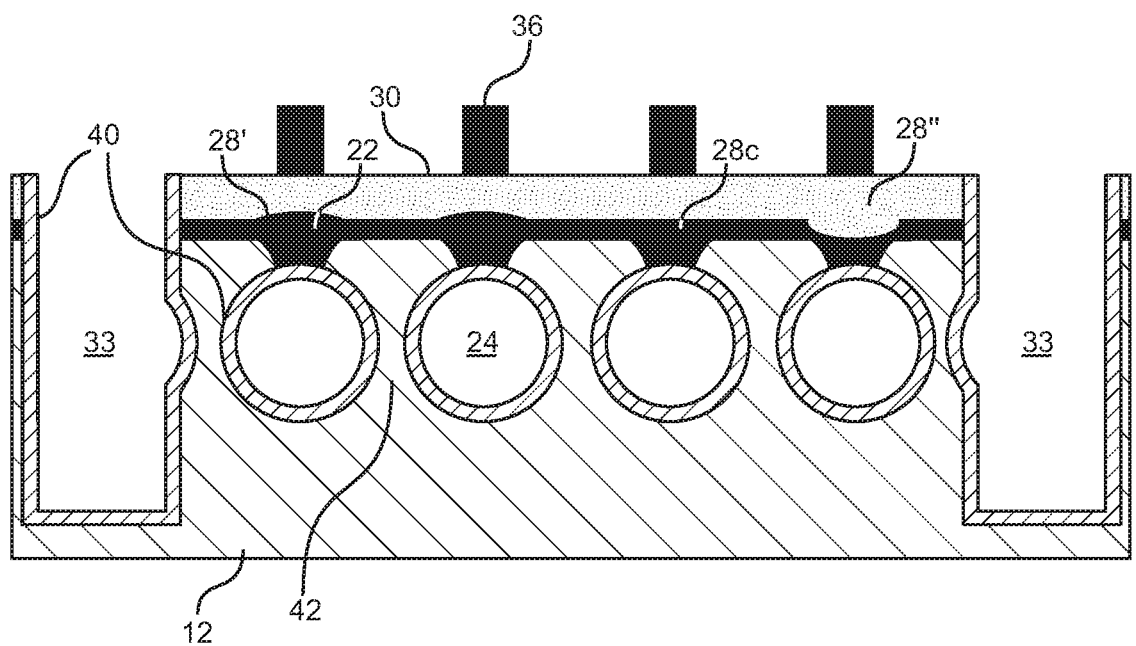
FIG. 2B-2D show various cross-sectional views of the structure shown in FIG. 2A.
Figure 2C:
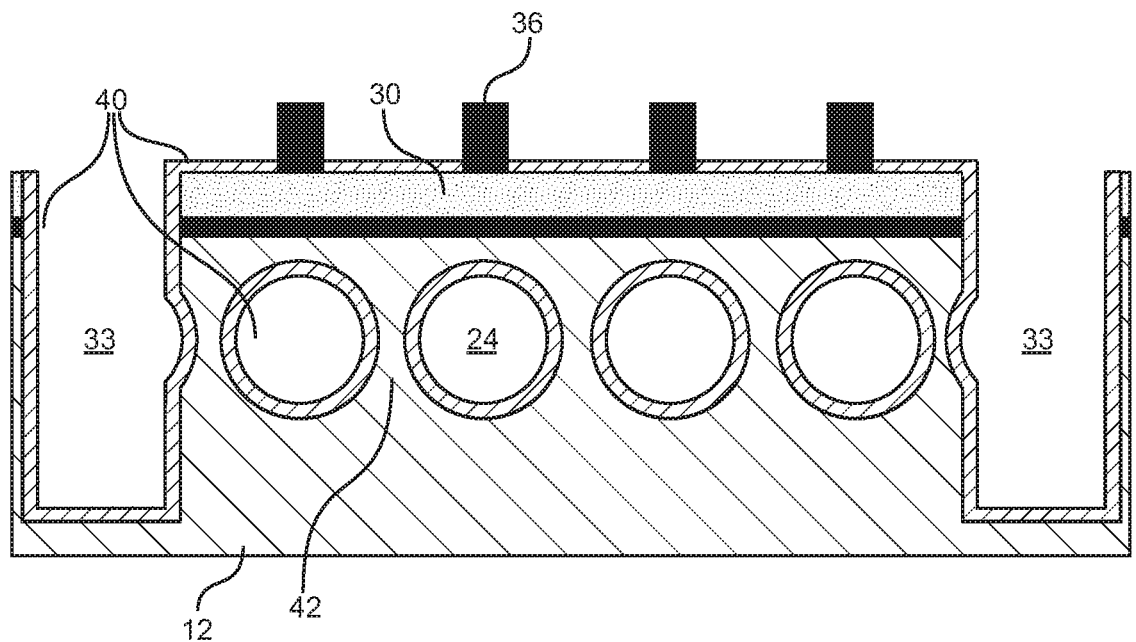
Figure 2D:
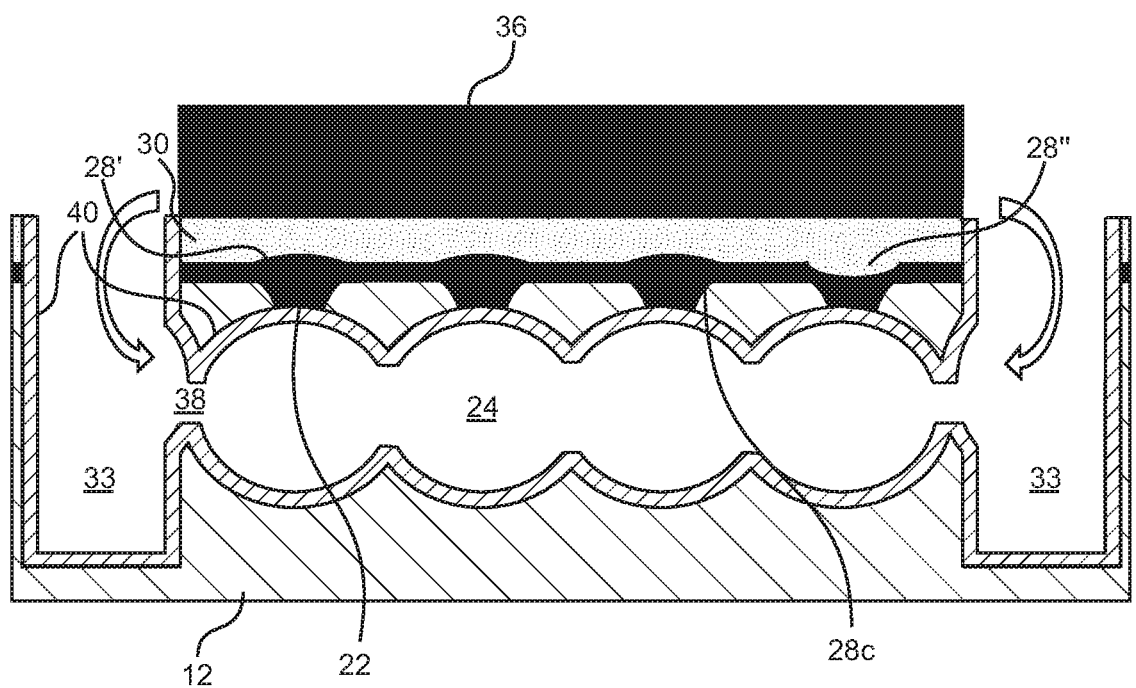

FIGS. 2A-2D show structures and respective fabrication processes in accordance with aspects of the present disclosure. FIG. 2A shows a top view of a FET array 36 containing sealed cavity structures 24 under the FET array and a deep trench isolation 33 surrounding the FET array. Outside of the deep trench isolation 33, the silicon substrate 12 extends outward to the wafer or chip edge. Note that silicon substrate 12 is drawn as a narrow layer surrounding the deep trench isolation 33 but, in actuality, would extend outwards to either the edge of the chip or wafer, other devices, or the next trench isolation. In particular, FIG. 2A shows a top view of the cavity structures 24 and trench isolation region 33 lined with oxide, with FIGS. 2B-2D being cross-sectional views of the structure of FIG. 2A. Specifically, FIG. 2B shows a cross-sectional view along cut "A" of the structure of FIG. 2A, FIG. 2C shows a cross-sectional view along cut "B" of the structure of FIG. 2A, and FIG. 2D shows a cross-sectional view along cut "C" of the structure of FIG. 2A.

Referring to FIGS. 2A-2D, a trench structure 33 is formed within the substrate 12, surrounding an active region 36. The trench structure 33 can be a shallow trench isolation (STI) structure, a deep trench isolation structure or other isolation structures. The active region, e.g., active devices 36 (e.g., transistors, etc.), can be fabricated in any known process, e.g., gate first or replacement gate processes. The cavity structures 24 can be under the active devices 36, under the gate, under the source drain regions, under both, or under almost all of the active devices 36 or combinations thereof. As shown, for example, in FIG. 2B, the material 28 can have a convex surface 28', concave surface 28" or a flat surface 28c.

In embodiments, the trench structure 33 are formed by conventional lithography and etching processes, followed by deposition of insulator material. By way of example, a resist formed over the semiconductor layer 30 is exposed to energy (light) to form a pattern (opening). An etching process with a selective chemistry, e.g., RIE, will be used to form one or more trenches in the optional dielectric films (not shown) on the semiconductor layer 30, the semiconductor layer 30 and substrate 12 through the openings of the resist. The resist can then be removed by a conventional oxygen ashing process or other known stripants. As shown in FIG. 2D, the trenches 33 will connect to and open a pathway 38 to the cavity structures 24.

Following the formation of the trench structure 33, a dielectric deposition or growth such as an oxidization process is performed to line the cavity structures 24 and the trench structures 33 (which form the STI structures 33) with a dielectric material 40, e.g., oxide material. In one embodiment, the oxidation process can be a directional oxidation process through the trench structure 33 and into the cavity structures 24 as indicated by the curved arrows in FIG. 2D. For example, the directional deposition process can include creating an electric field in the deposition chamber (e.g., a chemical vapor deposition or sputtering chamber) so as to accelerate the charged ions of the dielectric towards the semiconductor material of the substrate 12 and, more specifically, within the trench structure 33 and into the cavity structures 24. In this way, the sidewalls of the cavity structures 24 (including the sealing material 28, e.g., SiGe) can be completely coated with the oxide material 40. In this embodiment, the cavity structures 24 will be partially filled with oxide material 40; although as shown in FIGS. 4A-4D, for example, the cavity structures 24 can be completely filled with oxide material. Forming a thermal oxidization on the exposed cavity walls may reduce or passivate surface states on the cavity walls which can degrade passive or active (i.e. FET) functionality. Any dielectric deposition can be used to fill the trenches 33 and partially or wholly fill the cavity 12, such as ALD, CVD, PVD, etc. In one exemplary embodiment, the walls of the cavity structures 24 are thermally oxidized to eliminate surface electronic states, which can degrade rf device performance, and the cavity structures 24 and trench 33 are subsequently filled with the cavity structures being partially or wholly sealed.

In embodiments, the oxidation process also results in oxidized Si pillars 42 between the cavity structures 24, and oxide material 40 on a surface of the semiconductor layer 30. This results in complete isolation of the FET 36 from the substrate 12. The oxidized pillars 42 can be of different dimensions depending on the amount of oxidation on the sidewalls of the cavity structures 24, the dimensions of the cavity structures 24 and a spacing between the cavity structures 24. For example, the oxidized pillars 42 between the cavity structures 24 can range from about 50 nm to about 500 nm; although other dimensions are also contemplated herein. In embodiments, the oxidized pillars 42 are on the perimeter or other regions in the switch bank (e.g., active devices 36). This may enable the substrate material to act as heat sink.

Figure 3A:
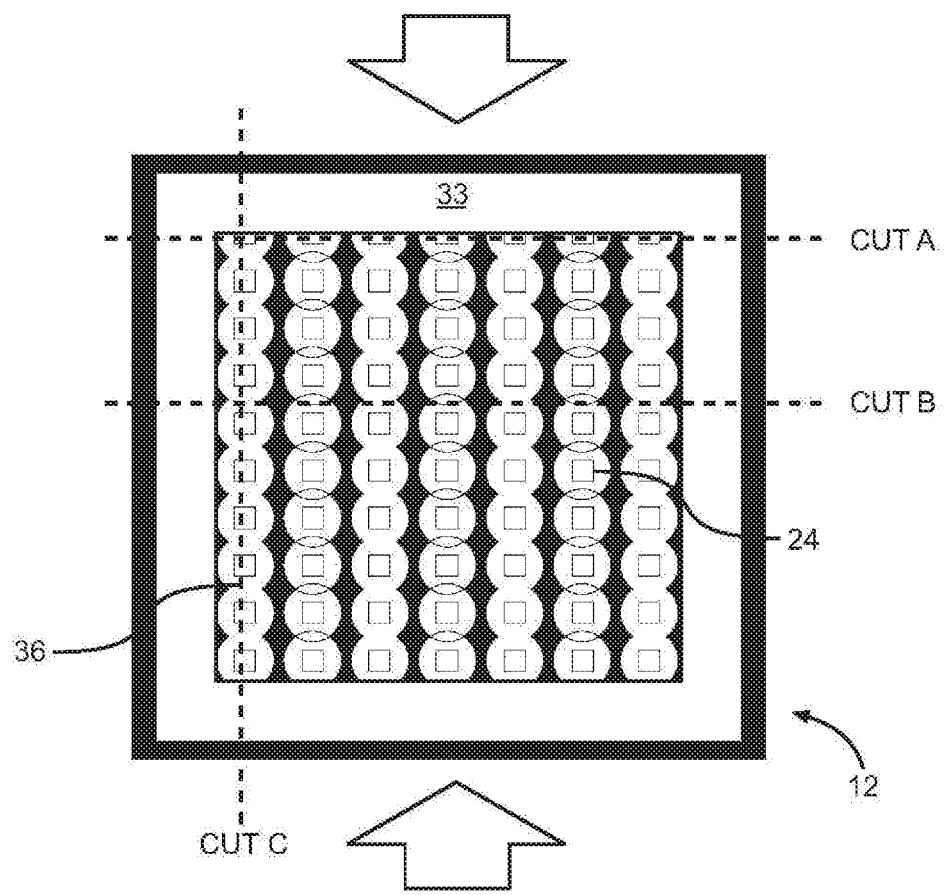
Figure 3B:
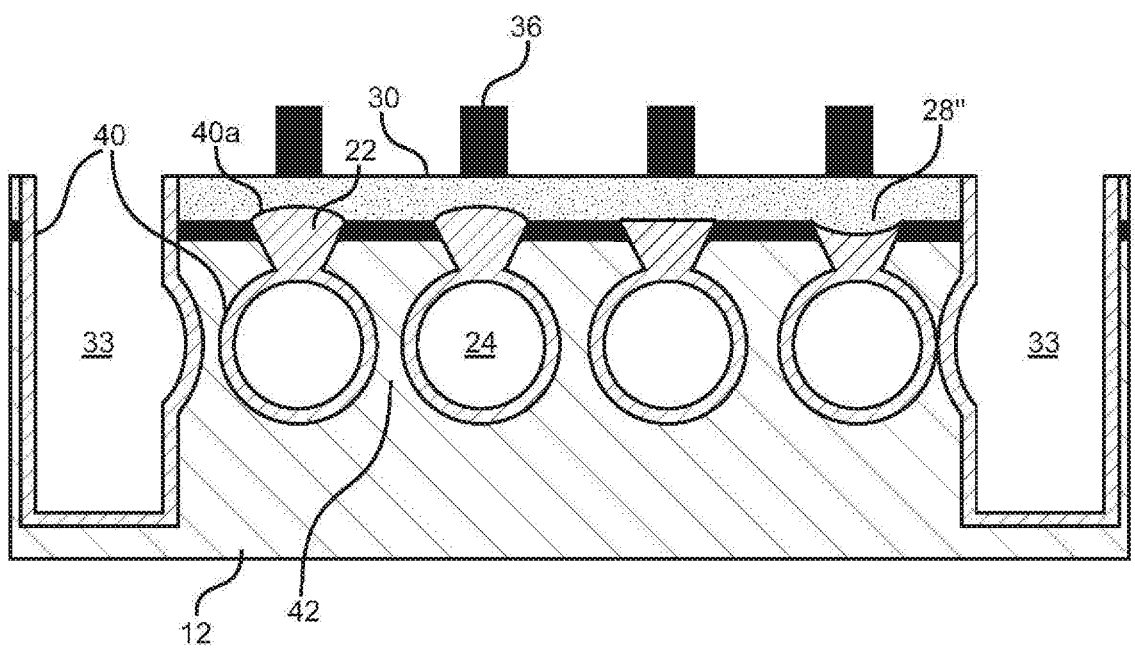
FIG. 3B-3D show various cross-sectional views of the structure shown in FIG. 3A.
Figure 3C:
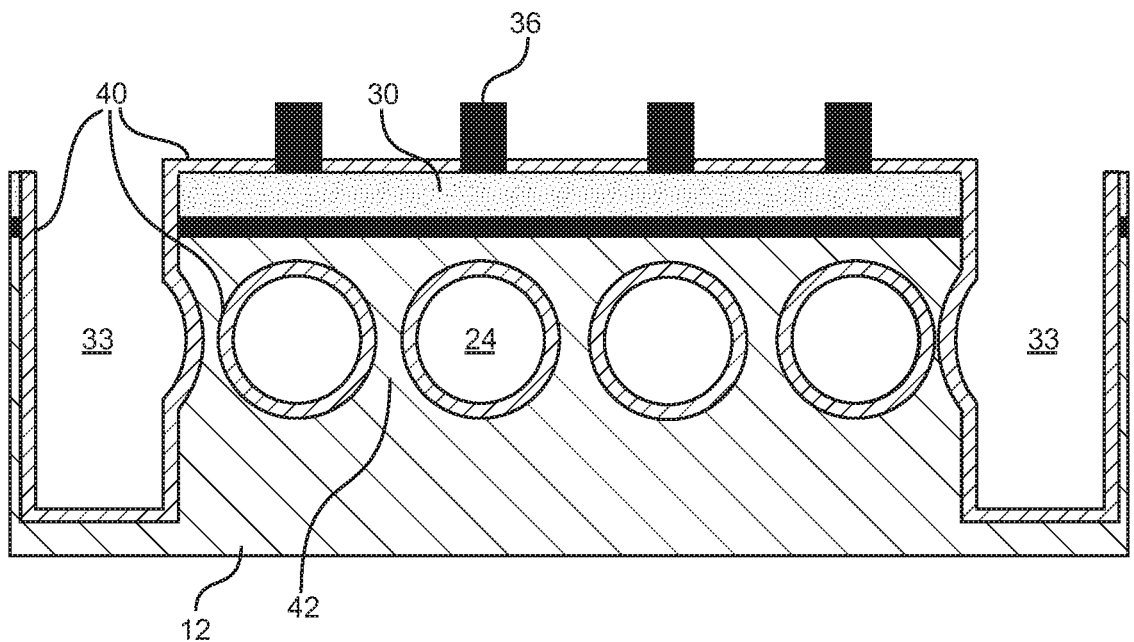
Figure 3D:
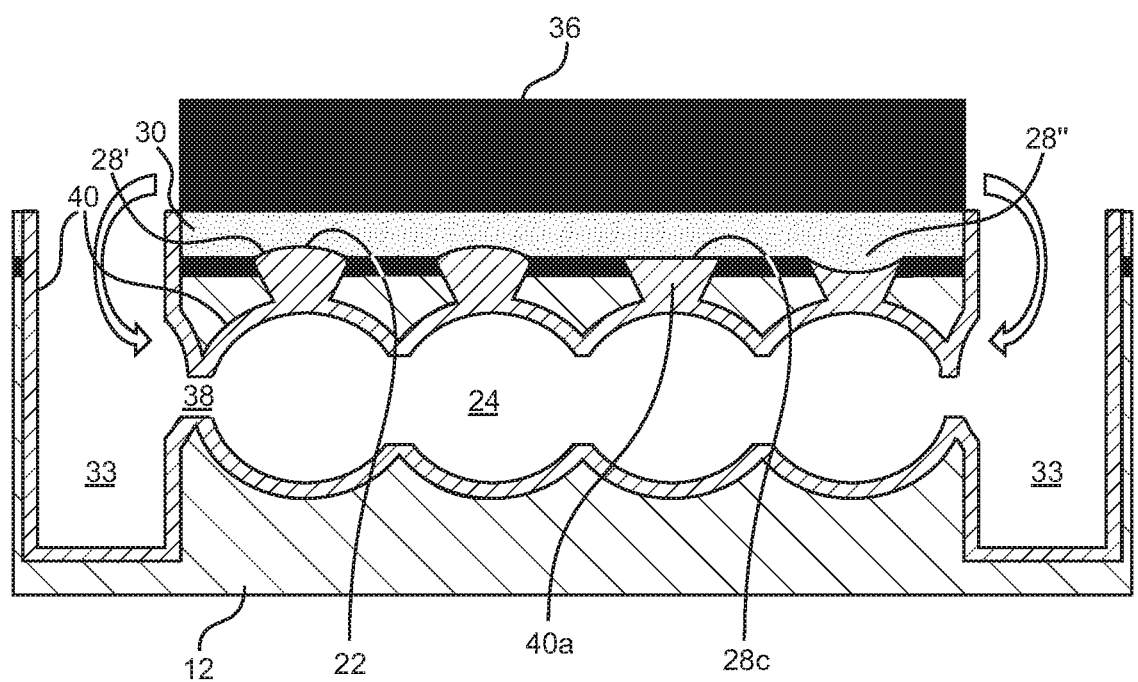

FIGS. 3A-3D show structures and respective fabrication processes in accordance with additional aspects of the present disclosure. FIG. 3A shows a top view of the cavity structures 24 sealed with oxide material 40a, and FIGS. 3B-3D are cross-sectional views of the structure of FIG. 3A. Specifically, FIG. 3B shows a cross-sectional view along cut "A" of the structure of FIG. 3A, FIG. 3C shows a cross-sectional view along cut "B" of the structure of FIG. 3A, and FIG. 3D shows a cross-sectional view along cut "C" of the structure of FIG. 3A.

As shown in FIGS. 3A-3D, the cavity structures 24 are sealed with oxide material 40a. In embodiments, the oxide material 40a that is sealing the cavity structures 24 can be provided by a CVD process or other deposition process, prior to the oxidation process which lines or fills the cavity structures 24 with the oxide material 40. In more specific embodiments, the cavity structures 24 can be sealed with oxide material 40a following the processes of FIG. 1F. As discussed above, the cavity walls could be thermally oxidized to remove surface electronic states, prior to the CVD film deposition. The remaining features and processes of FIGS. 3A-3D are similar to that already described and shown in FIGS. 2A-2D such that no further explanation is required for an understanding of the present disclosure.

Figure 4A:
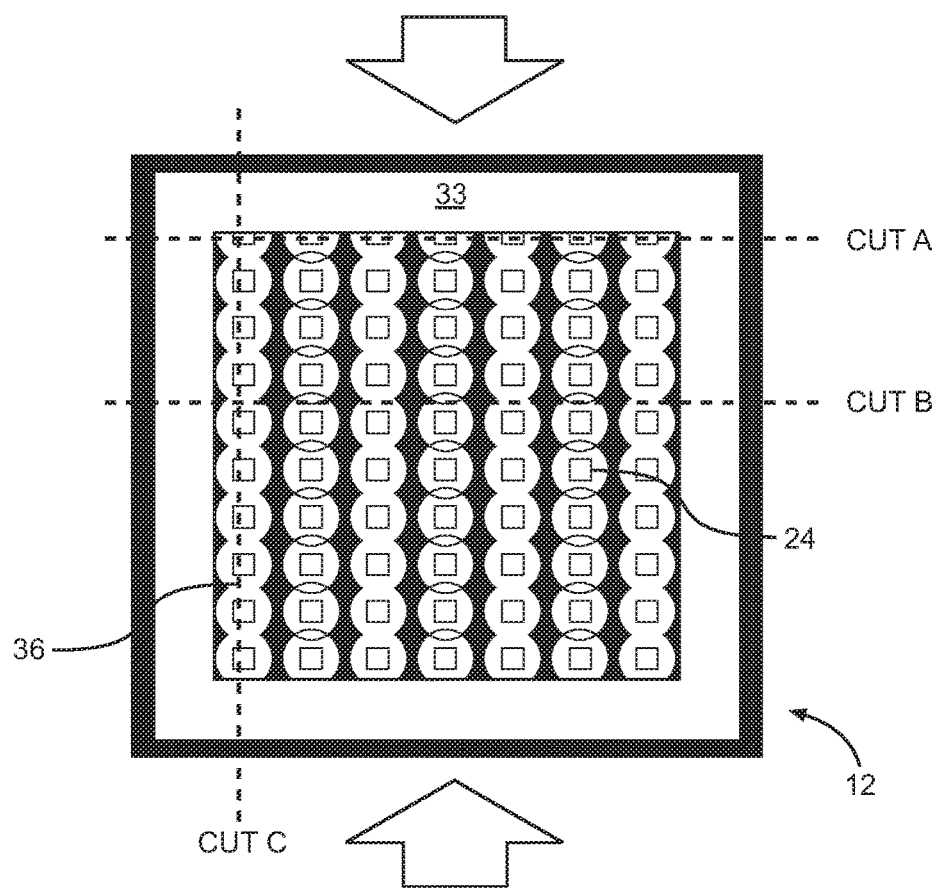
Figure 4B:
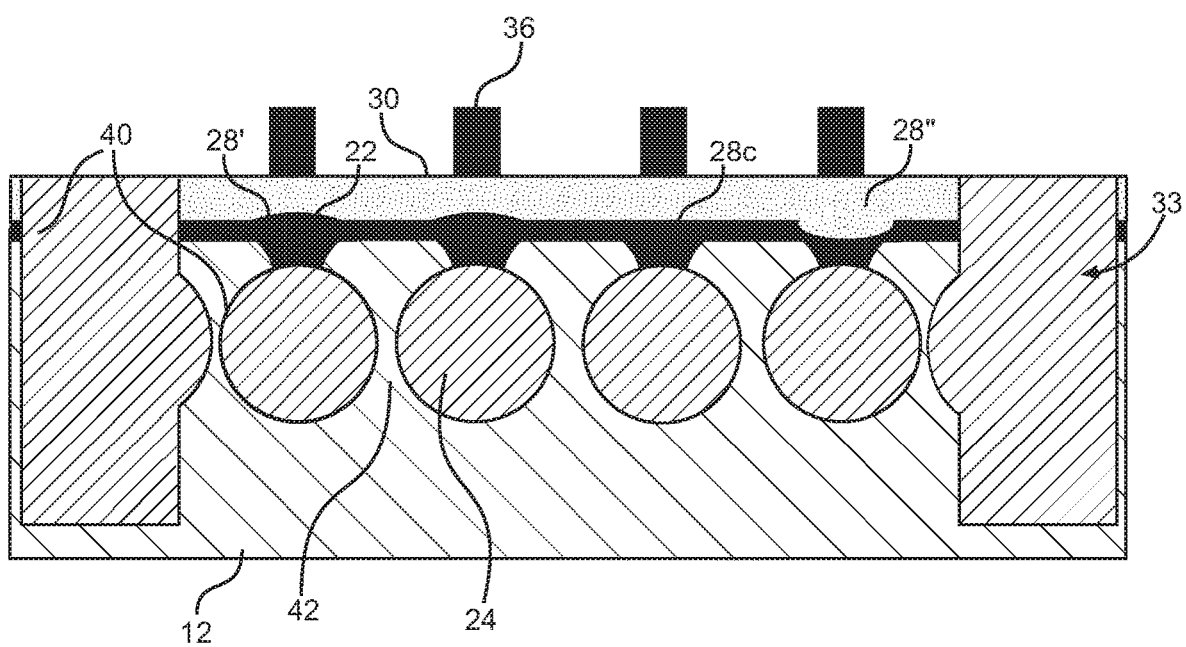
FIG. 4B-4D show various cross-sectional views of the structure shown in FIG. 4A.
Figure 4C:
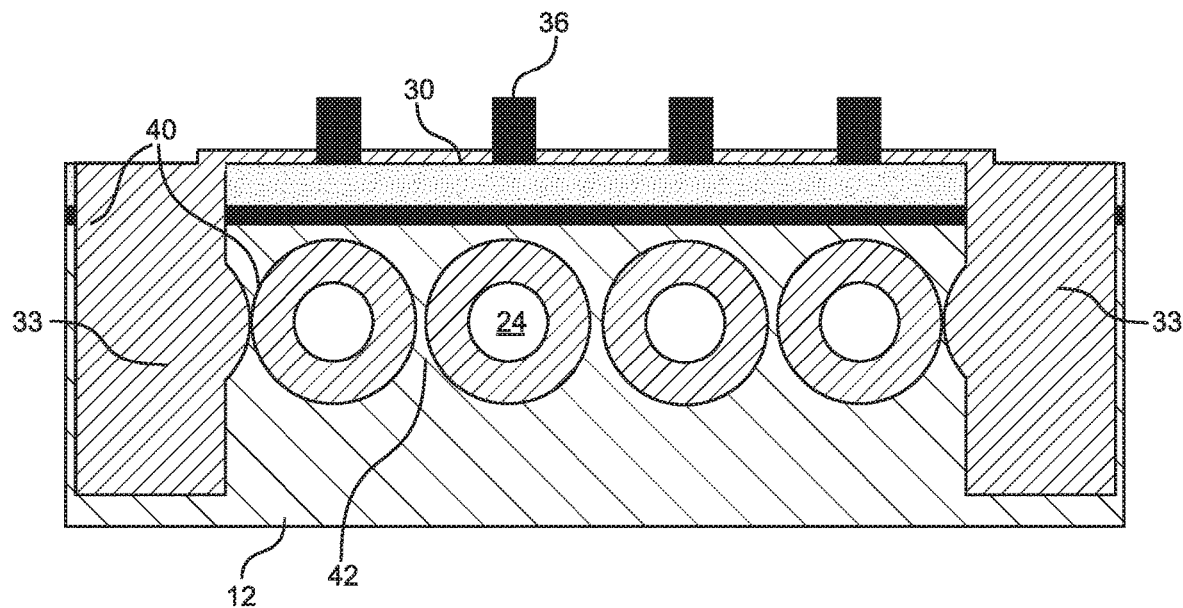
Figure 4D:
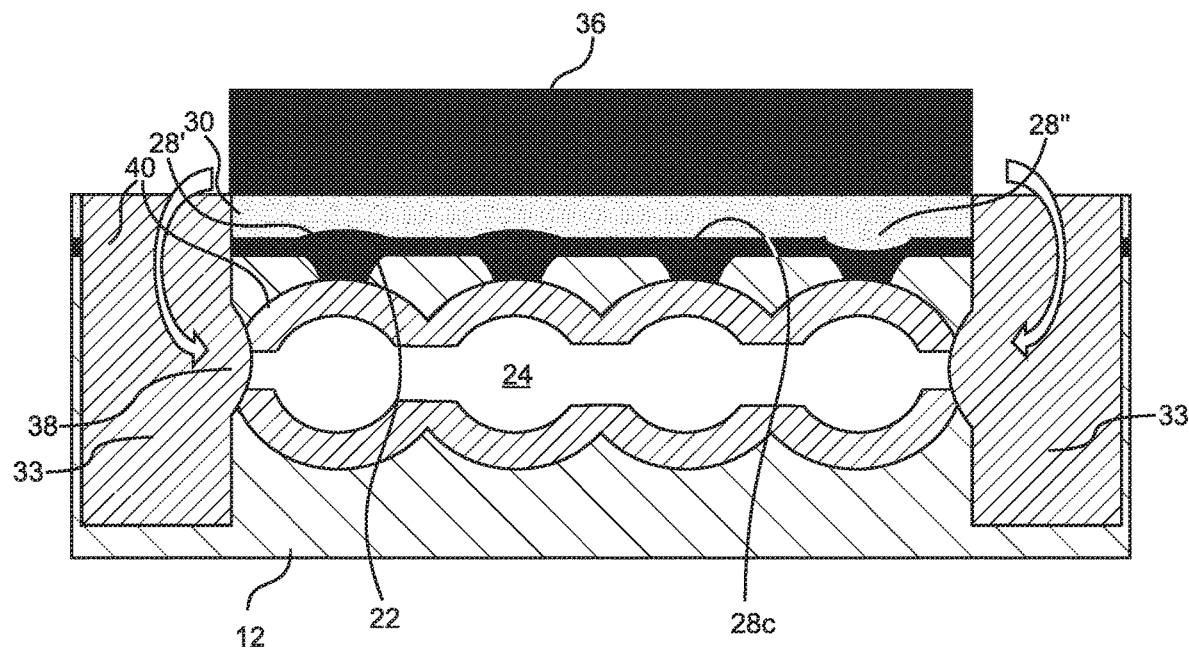

FIGS. 4A-4D show structures and respective fabrication processes in accordance with yet additional aspects of the present disclosure. FIG. 4A shows a top view of the cavity structures 24 with the trench structures 33 completely filled with oxide material 40, and FIGS. 4B-4D are cross-sectional views of the structure of FIG. 4A. Specifically, FIG. 4B shows a cross-sectional view along cut "A" of the structure of FIG. 4A, FIG. 4C shows a cross-sectional view along cut "B" of the structure of FIG. 4A, and FIG. 4D shows a cross-sectional view along cut "C" of the structure of FIG. 4A.

In particular, FIG. 4B shows the trench structure 33 is completely filled with the oxide material 40. The cavity structures 24 shown in FIG. 4B are also completely filled with the oxide material 40 by a deposition through the trench structure 33; whereas, portions of the cavity structures 24 shown in FIGS. 4C and 4D are partially filled with the oxide material 40. In embodiments, the oxide fill can be performed by a flowable oxide and ALD processes. Following the oxide fill process, any excess material on the surface of the semiconductor material 30 and over the trench structures 33 can be planarized using a CMP process. The remaining features and processes of FIGS. 4A-4D are similar to that already described and shown in FIGS. 2A-2D such that no further explanation is required for an understanding of the present disclosure. It should be recognized, though, that the cavity structures 24 shown in FIGS. 4A-4D can also be sealed with the oxide material as described with respect to FIGS. 3A-3D (instead of the SiGe material as shown in FIGS. 2A-2D).

Figure 5A:
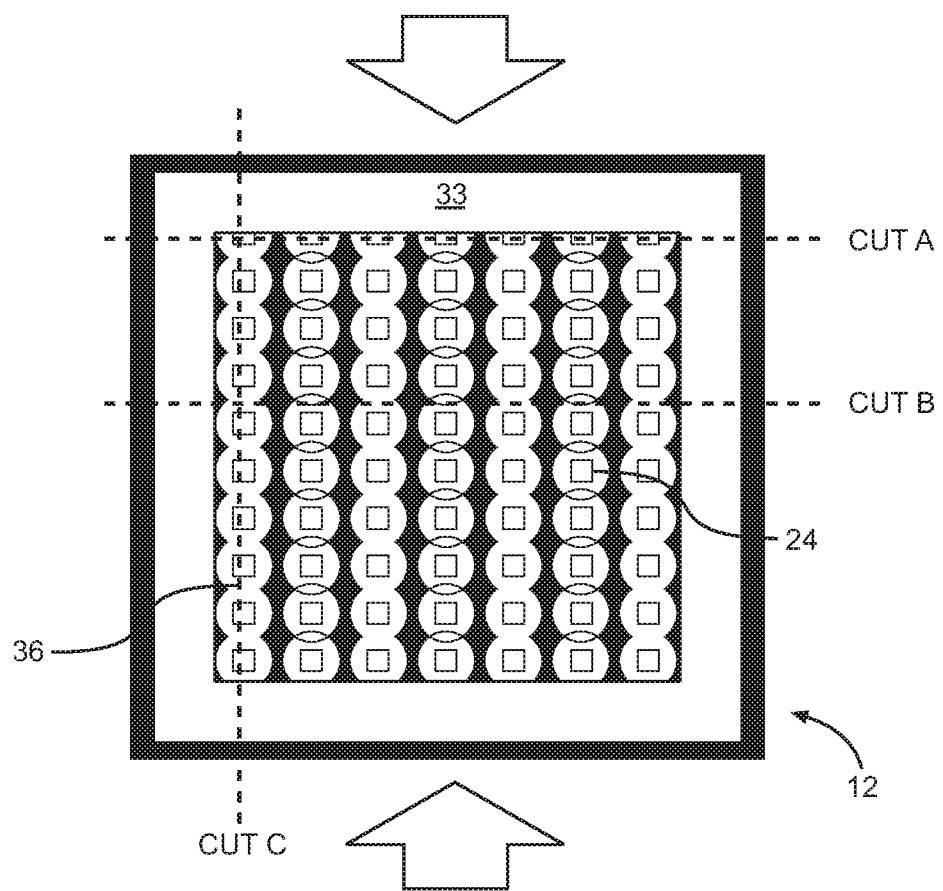
Figure 5B:
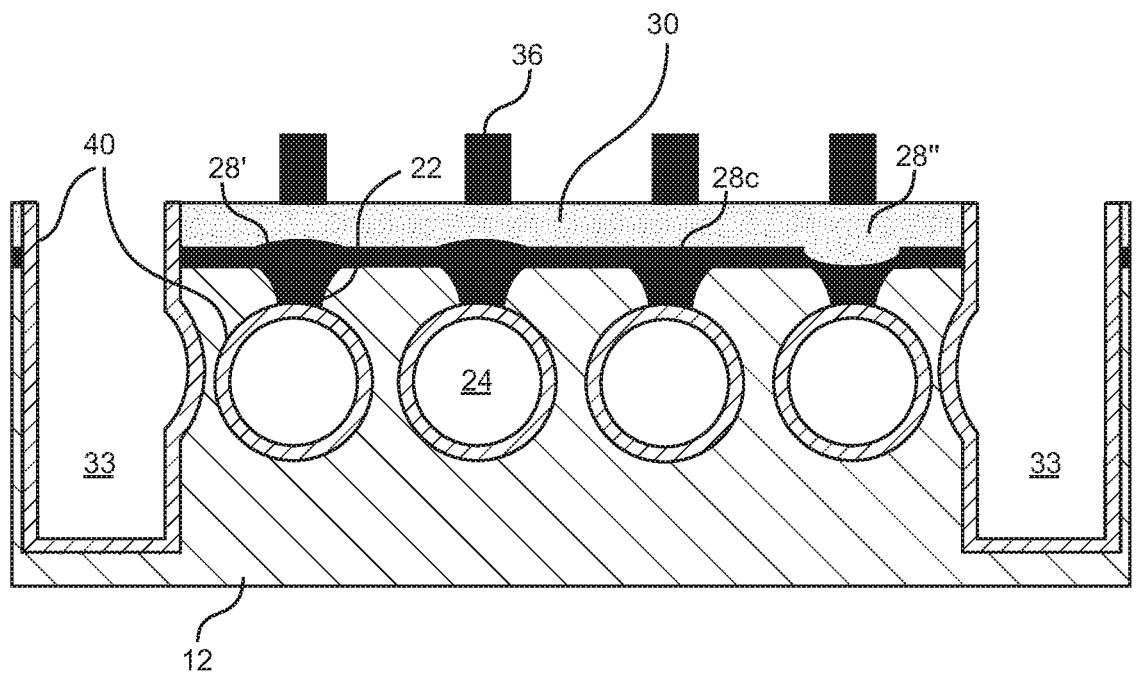
FIG. 5B-5D show various cross-sectional views of the structure shown in FIG. 5A.
Figure 5C:
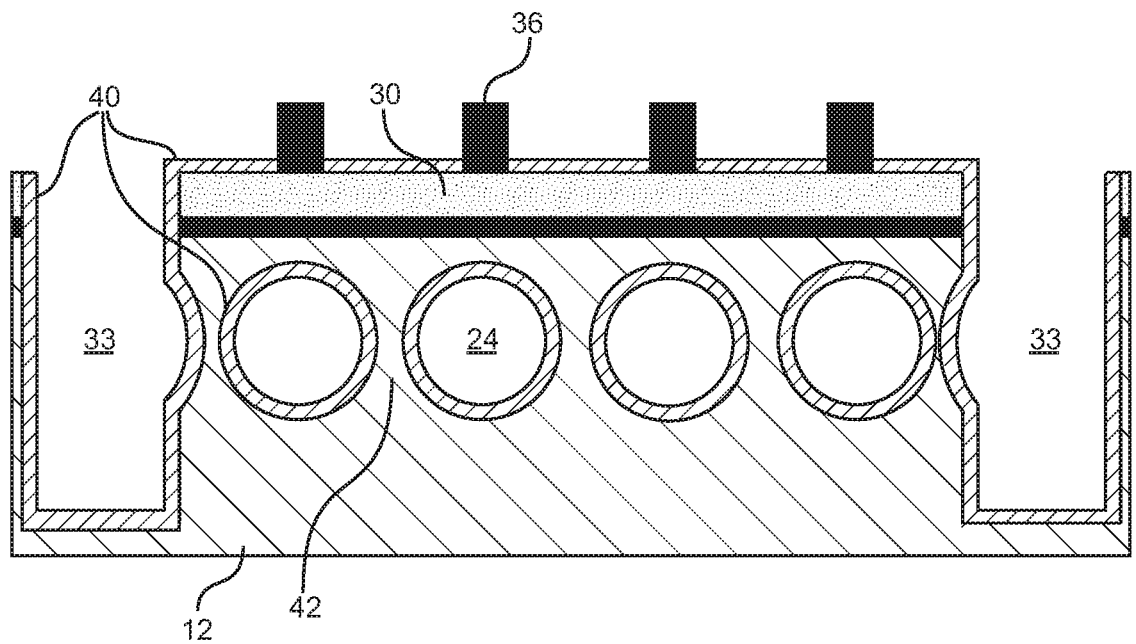
Figure 5D:
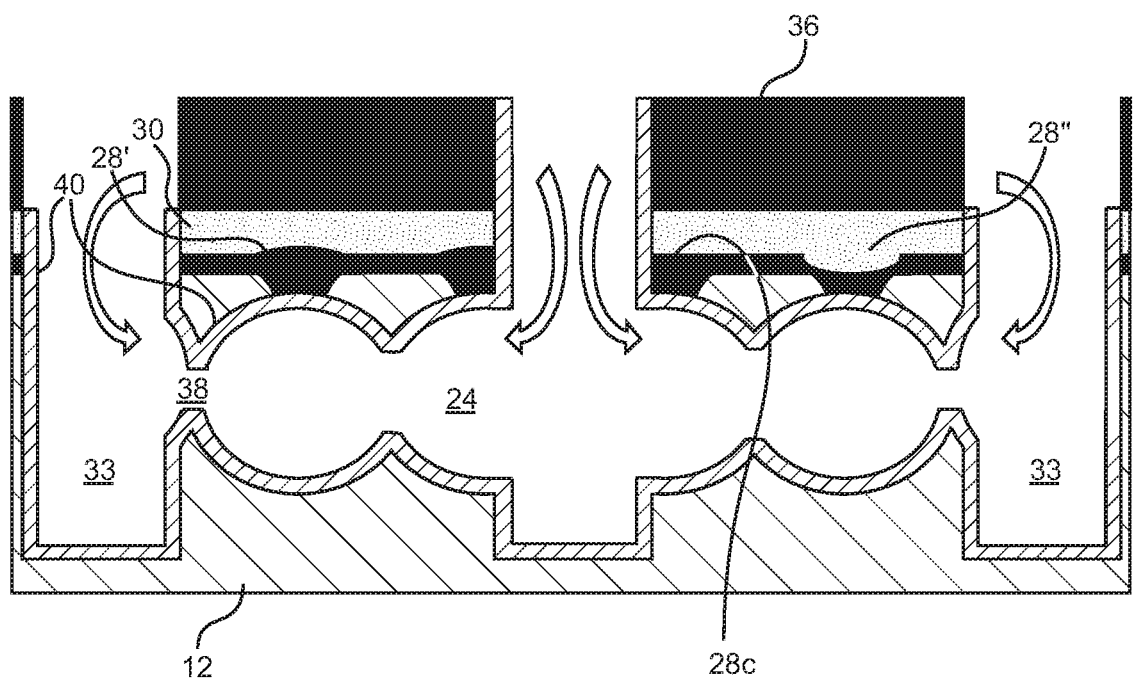

FIGS. 5A-5D show structures and respective fabrication processes in accordance with further aspects of the present disclosure. FIG. 5A shows a top view of the cavity structures 24 with trench structures 33, 33a, and FIGS. 5B-5D are cross-sectional views of the structure of FIG. 5A. Specifically, FIG. 5B shows a cross-sectional view along cut "A" of the structure of FIG. 5A, FIG. 5C shows a cross-sectional view along cut "B" of the structure of FIG. 5A, and FIG. 5D shows a cross-sectional view along cut "C" of the structure of FIG. 5A. In this representation, the trench structure 33a is a bar shape to enable multi direction oxidation processes as by the multiple arrows in FIG. 5D.

Figure 6A:
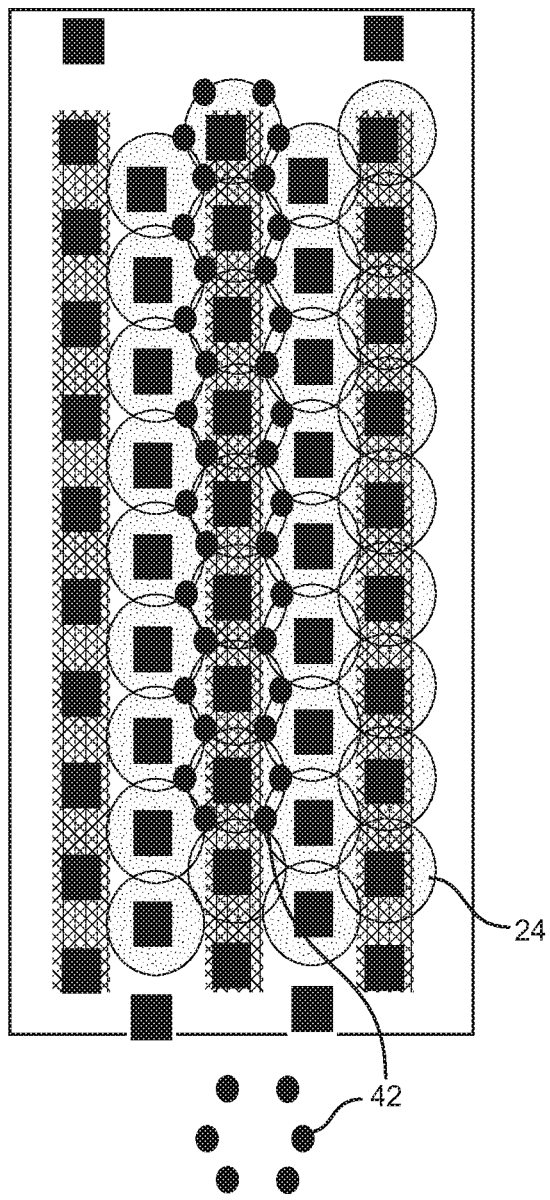
FIGS. 6A-6D show different cavity structure layouts and respective fabrication processes in accordance with further aspects of the present disclosure.
Figure 6B:
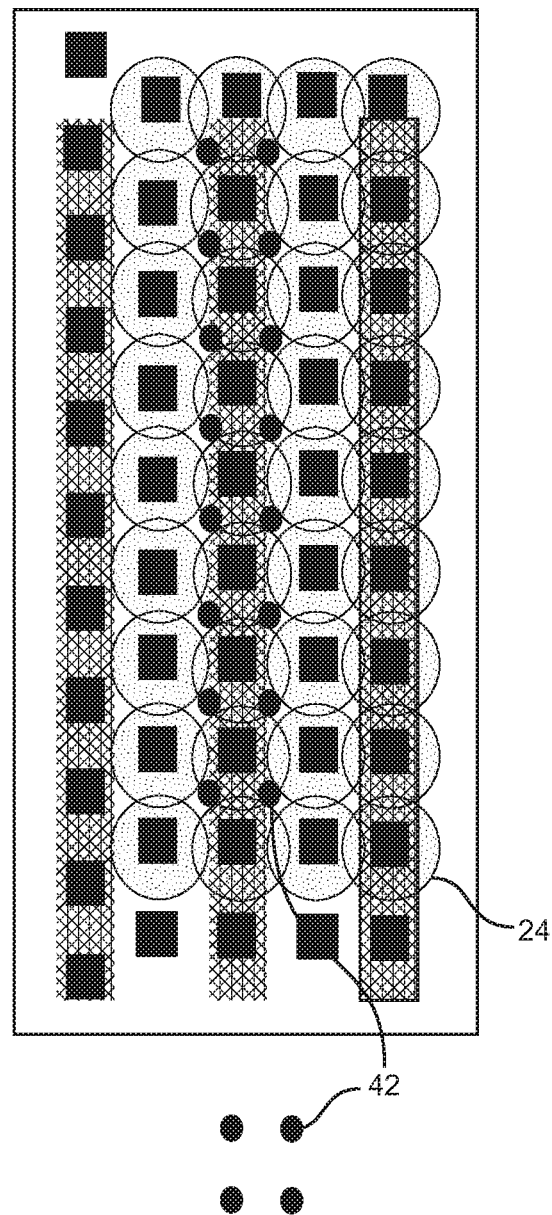
Figure 6C:
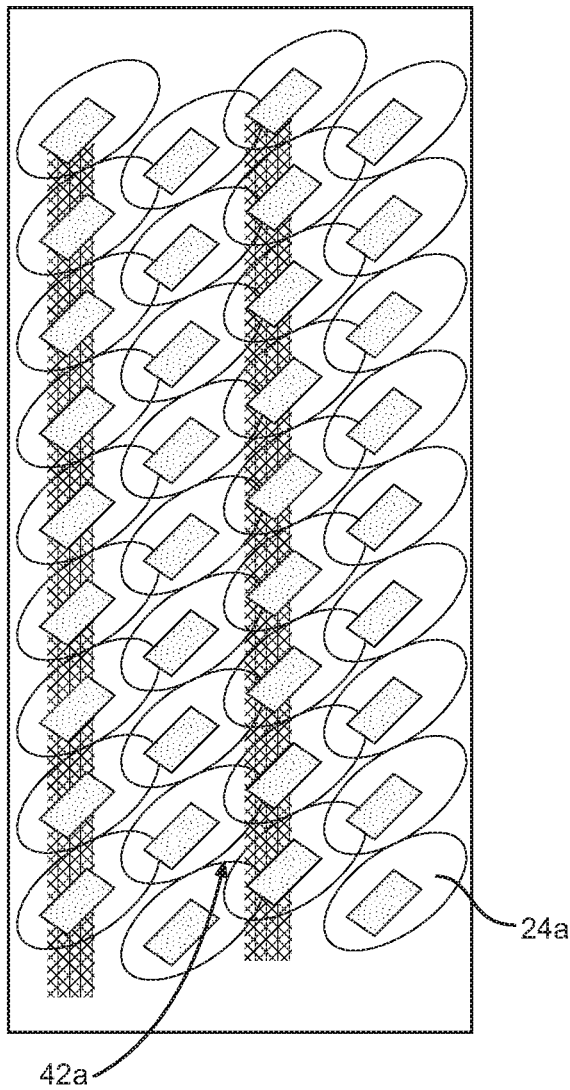
Figure 6D:
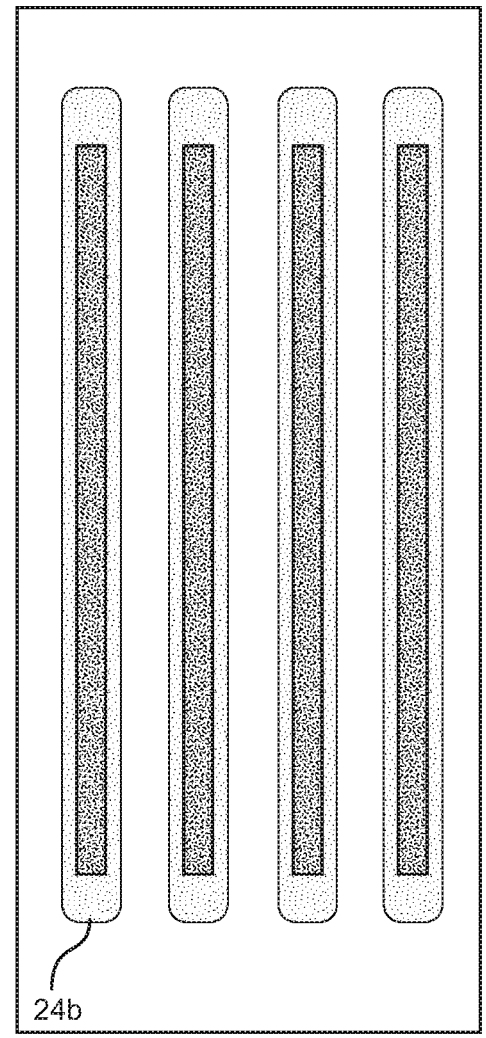

FIGS. 6A-6D show different cavity and pillar layouts in accordance with further aspects of the present disclosure. In particular, FIG. 6A shows the cavity structures 24 in a staggered layout with the oxidized pillars 42 forming a circular layout. FIG. 6B shows the cavity structures 24 in an aligned layout with the oxidized pillars 42 forming a rectangular or square layout. FIG. 6C shows oval shaped cavity structures 24a which enables merging of cavity structures 24a in all four directions with different spacing in the longitudinal and latitudinal directions to accommodate larger PC-PC spacing. In this embodiment, the oxidized pillars 42a are diamond shaped. FIG. 6D shows bar shaped cavity structures 24b (e.g., single trenches instead of separate cavities).

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:
1. A structure comprising:
a substrate material;
an oxidized trench isolation structure extending into the substrate material;
trenches extending into the substrate material;
oxidized cavity structures extending from respective ones of the trenches, the oxidized cavity structures being surrounded by the oxidized trench isolation structure, the oxidized cavity structures being formed in the substrate material under active devices and being isolated from one another by pillars comprising oxidized substrate material, and wherein the oxidized cavity structures comprise a dielectric liner lining a sidewall thereof and spanning underneath and between sidewalls of the trenches,
wherein the oxidized cavity structures are connected to an opening in the substrate material which is completely filled with epitaxial semiconductor material that has a at least one of a bowed up topography, a bowed down topography and a planar topography, and the epitaxial semiconductor material seals the oxidized cavity structures by plugging the opening from a top surface of the substrate material.
2. The structure of claim 1, wherein the substrate material is crystalline semiconductor material.
3. The structure of claim 1, wherein sidewalls of the oxidized cavity structures are lined with dielectric material.
4. The structure of claim 3, wherein the oxidized cavity structures are connected to the oxidized trench isolation structure and the oxidized trench isolation structure is only partially filled with the dielectric material such that an open pathway is provided between the oxidized trench isolation structure and the oxidized cavity structures.

5. The structure of claim 1, wherein the oxidized cavity structures are connected to an opening in the substrate material which is completely filled dielectric material.

6. The structure of claim 1, wherein the oxidized cavity structures are located under one or more of: a channel, a source/drain, or both.

7. The structure of claim 1, wherein the substrate material between the oxidized cavity structures are pillar structures acting as heat sinks.

8. The structure of claim 7, wherein the pillar structures are arranged in a circular, rectangular or square pattern.

9. The structure of claim 1, wherein the oxidized trench isolation structure extends into the substrate material to a depth that is below a bottom surface of the oxidized cavity structures.

10. A structure comprising:
   a crystalline substrate material with an active region;
   at least one trench formed in the crystalline substrate material;
   a plurality of oxidized cavity structures formed in the crystalline substrate material under the active region and extending from and connected to the at least one trench, each of the plurality of oxidized cavity structures comprising an oxidized sidewall and separated from one another by a pillar structure comprising oxidized crystalline substrate material which extends to and contacts epitaxial material above the plurality of oxidized cavity structures;
   an oxidized trench isolation structure extending into the crystalline substrate material and which surrounds and connects to the outer oxidized cavity structures of the plurality of cavity structures, the oxidized trench isolation structure also surrounds the active region; and
   a material plugging the at least one trench to seal the at least one oxidized cavity structure.

11. The structure of claim 10, wherein sidewalls of the plurality of oxidized cavity structures are lined with dielectric material, and the oxidized trench isolation structure is partially filled with the dielectric material, and the oxidized trench isolation structure extends to a depth below a bottom of the at least one oxidized cavity structure.

12. The structure of claim 10, wherein the plurality of oxidized cavity structures extend from a bottom portion of the trench in the crystalline substrate material, the at least one trench extending from a top surface of the crystalline substrate material and which also are filled with epitaxial semiconductor material or dielectric material.

13. The structure of claim 10, wherein the crystalline substrate material between the oxidized cavity structures are oxidized pillar structures.

14. A method, comprising:
   forming a trench isolation structure into a substrate material and which surrounds an active area;
   forming trenches extending into the substrate material;
   forming cavity structures in the substrate material under the active area and extending from respective ones of the trenches, the cavity structure being open to the isolation trench structure and being under the active area and separated from one another by the substrate material; and
   oxidizing at least sidewalls of the cavity structures through the opening extending from the trench isolation structure and which forms a dielectric liner underneath and between sidewalls of the trenches,
   wherein the oxidized cavity structures are connected to an opening in the substrate material which is completely filled with epitaxial semiconductor material that has a at least one of a bowed up topography, a bowed down topography and a planar topography, and the epitaxial semiconductor material seals the oxidized cavity structures by plugging the opening from a top surface of the substrate material.

15. The method of claim 14, wherein the cavity structures are sealed with SiGe material are also oxidized.

16. The method of claim 14, wherein the oxidizing at least the sidewalls of the cavity structures comprises thermally oxidizing the sidewalls of the cavity prior to filling them with dielectric material.

17. The method of claim 14, wherein the cavity structures and the trench isolation structure are both lined with dielectric material.

* * * * *